(12) United States Patent
Malouin et al.

(10) Patent No.: US 12,048,118 B2
(45) Date of Patent: Jul. 23, 2024

(54) FLOW-THROUGH, HOT-SPOT-TARGETING IMMERSION COOLING ASSEMBLY

(71) Applicant: Jetcool Technologies Inc., Littleton, MA (US)

(72) Inventors: Bernard Malouin, Westford, MA (US); Jordan Mizerak, Belmont, MA (US)

(73) Assignee: JetCool Technologies Inc., Littleton, MA (US)

( * ) Notice: Subject to any disclaimer, the term of this patent is extended or adjusted under 35 U.S.C. 154(b) by 0 days.

(21) Appl. No.: 17/703,595

(22) Filed: Mar. 24, 2022

(65) Prior Publication Data
US 2023/0048500 A1 Feb. 16, 2023

Related U.S. Application Data

(60) Provisional application No. 63/232,943, filed on Aug. 13, 2021.

(51) Int. Cl.
*H05K 7/20* (2006.01)
*H01L 23/473* (2006.01)
*H01L 23/40* (2006.01)

(52) U.S. Cl.
CPC ..... *H05K 7/20272* (2013.01); *H05K 7/20236* (2013.01); *H05K 7/20263* (2013.01);
(Continued)

(58) Field of Classification Search
CPC ........... H05K 7/20236; H05K 7/20254; H05K 7/20272; H05K 7/20763; H05K 7/20772; H01L 23/473–4735
See application file for complete search history.

(56) References Cited

U.S. PATENT DOCUMENTS

| 236,519 A | 1/1881 | Walsh |
| 3,765,728 A | 10/1973 | Peruglia |

(Continued)

FOREIGN PATENT DOCUMENTS

| CN | 102414813 B | 4/2014 |
| CN | 107567247 A | 1/2018 |

(Continued)

OTHER PUBLICATIONS

Vittorio Celli, "Compressible Fluids" Nov. 10, 1997 http://galileo.phys.virginia.edu/classes/311/notes/compflu2/node1.html#:~:text=All%20real%20fluids%20are%20compressible,and%20ultrasound%20at%20higher%20frequencies. (Year: 1997).*

*Primary Examiner* — Zachary Pape
(74) *Attorney, Agent, or Firm* — Grady L. White; Potomac Law Group, PLLC

(57) ABSTRACT

An immersion cooling assembly comprises at least one primary heat-generating electronic component and a flow-through cooling module mounted near the at least one primary heat-generating component. The flow-through cooling module comprises at least one inlet conduit to accept an inflow of pressurized dielectric coolant, a fluid chamber through which fluid flows to provide targeted, direct cooling to a heat-generating component, and exit passageways to facilitate flow-through of the dielectric coolant into a surrounding immersion bath for cooling of other components. As it flows out of the cooling module and over the heat-generating component, the coolant fluid absorbs heat from the heat-generating electronic component. In certain embodiments, the assembly may also comprise at least one periphery heat-generating electronic component, which may also be cooled by the dielectric coolant as it exits the vicinity of the flow-through cooling module. The cooling module may include impingement nozzles to accelerate and direct (Continued)

the flow of coolant fluid toward the high-heat-generating electronic component.

20 Claims, 16 Drawing Sheets

(52) U.S. Cl.
CPC ...... *H01L 23/4006* (2013.01); *H01L 23/4735* (2013.01); *H05K 7/20772* (2013.01)

(56) References Cited

U.S. PATENT DOCUMENTS

| | | | |
|---|---|---|---|
| 3,841,671 A | 10/1974 | Walker | |
| 3,980,112 A | 9/1976 | Basham | |
| 4,062,572 A | 12/1977 | Davis | |
| 4,090,539 A | 5/1978 | Krupp | |
| 4,696,496 A | 9/1987 | Guelis et al. | |
| 4,796,924 A | 1/1989 | Kosugi et al. | |
| 4,890,865 A | 1/1990 | Hosono et al. | |
| 4,922,971 A | 5/1990 | Grantham | |
| 5,021,924 A | 6/1991 | Kieda et al. | |
| 5,088,005 A | 2/1992 | Ciaccio | |
| 5,249,358 A | 10/1993 | Tousignant et al. | |
| 5,263,536 A | 11/1993 | Hulburd et al. | |
| 5,285,351 A | 2/1994 | Ikeda | |
| 5,309,319 A | 5/1994 | Messina | |
| 5,316,075 A | 5/1994 | Quon et al. | |
| 5,349,831 A | 9/1994 | Daikoku et al. | |
| 5,401,064 A | 3/1995 | Guest | |
| 5,491,363 A * | 2/1996 | Yoshikawa | H01L 23/4332 |
| | | | 257/E23.091 |
| 5,547,231 A | 8/1996 | Sharp | |
| 5,611,373 A | 3/1997 | Ashcraft | |
| 5,687,993 A | 11/1997 | Brim | |
| 5,720,325 A | 2/1998 | Grantham | |
| 5,959,351 A | 9/1999 | Sasaki et al. | |
| 5,999,404 A | 12/1999 | Hileman | |
| 6,105,373 A | 8/2000 | Watanabe et al. | |
| 6,144,013 A | 11/2000 | Chu et al. | |
| 6,366,462 B1 | 4/2002 | Chu et al. | |
| 6,528,878 B1 | 3/2003 | Daikoku et al. | |
| 6,546,951 B1 | 4/2003 | Armenia et al. | |
| 6,550,263 B2 | 4/2003 | Patel et al. | |
| 6,550,815 B2 | 4/2003 | Zitkowic, Jr. et al. | |
| 6,729,383 B1 | 5/2004 | Cannell et al. | |
| 6,952,346 B2 * | 10/2005 | Tilton | H05K 7/20345 |
| | | | 174/15.1 |
| 6,973,801 B1 * | 12/2005 | Campbell | H01L 23/473 |
| | | | 361/698 |
| 7,007,506 B2 | 3/2006 | Kubo et al. | |
| 7,104,312 B2 | 9/2006 | Goodson et al. | |
| 7,149,087 B2 | 12/2006 | Wilson et al. | |
| 7,223,494 B2 | 5/2007 | Takeshita et al. | |
| 7,233,494 B2 | 6/2007 | Campbell et al. | |
| 7,241,423 B2 | 7/2007 | Golbig et al. | |
| 7,265,976 B1 | 9/2007 | Knight | |
| 7,277,283 B2 | 10/2007 | Campbell et al. | |
| 7,511,957 B2 | 3/2009 | Campbell et al. | |
| 7,787,248 B2 | 8/2010 | Campbell et al. | |
| 7,802,442 B2 | 9/2010 | Bezama et al. | |
| 7,866,173 B2 | 1/2011 | Brunschwiler et al. | |
| 7,916,483 B2 * | 3/2011 | Campbell | H05K 7/20772 |
| | | | 165/80.4 |
| 7,978,473 B2 | 7/2011 | Campbell et al. | |
| 7,992,627 B2 | 8/2011 | Bezama et al. | |
| 8,059,405 B2 | 11/2011 | Campbell et al. | |
| 8,266,802 B2 | 9/2012 | Campbell et al. | |
| 8,824,146 B2 | 9/2014 | Brok et al. | |
| 8,912,643 B2 | 12/2014 | Bock et al. | |
| 8,929,080 B2 | 1/2015 | Campbell et al. | |
| 8,944,151 B2 * | 2/2015 | Flotta | H05K 7/20772 |
| | | | 165/80.4 |
| 8,981,556 B2 | 3/2015 | Joshi | |
| 9,165,857 B2 | 10/2015 | Song et al. | |
| 9,247,672 B2 | 1/2016 | Mehring | |
| 9,252,069 B2 | 2/2016 | Bhunia et al. | |
| 9,445,529 B2 | 9/2016 | Chainer et al. | |
| 9,484,283 B2 | 11/2016 | Joshi et al. | |
| 9,521,787 B2 | 12/2016 | Chainer et al. | |
| 9,530,818 B2 | 12/2016 | Stern et al. | |
| 9,559,038 B2 | 1/2017 | Schmit et al. | |
| 9,560,790 B2 | 1/2017 | Joshi et al. | |
| 9,622,379 B1 | 4/2017 | Campbell et al. | |
| 9,638,477 B1 | 5/2017 | Choi et al. | |
| 9,653,378 B2 | 5/2017 | Hou et al. | |
| 9,750,159 B2 | 8/2017 | Campbell et al. | |
| 9,852,963 B2 | 12/2017 | Shedd et al. | |
| 9,901,008 B2 * | 2/2018 | Shedd | H05K 7/20327 |
| 9,903,664 B2 | 2/2018 | Joshi | |
| 10,078,354 B2 | 9/2018 | Eriksen et al. | |
| 10,096,537 B1 * | 10/2018 | Chen | F28D 15/0266 |
| 10,152,096 B1 | 12/2018 | Chen et al. | |
| 10,228,735 B2 | 3/2019 | Kulkarni et al. | |
| 10,270,220 B1 | 4/2019 | Eppich et al. | |
| 10,285,309 B2 | 5/2019 | James et al. | |
| 10,306,802 B1 | 5/2019 | Ditri et al. | |
| 10,426,062 B1 | 9/2019 | Saunders | |
| 10,473,252 B2 | 11/2019 | Oberdorfer et al. | |
| 10,512,152 B2 | 12/2019 | Smith et al. | |
| 10,561,040 B1 | 2/2020 | Lunsman et al. | |
| 10,651,112 B2 | 5/2020 | Malouin, Jr. et al. | |
| 10,665,529 B2 | 5/2020 | Smith et al. | |
| 10,903,141 B2 | 1/2021 | Malouin, Jr. et al. | |
| 10,985,089 B2 | 4/2021 | Hart et al. | |
| 11,018,077 B2 | 5/2021 | Smith et al. | |
| 11,096,313 B2 * | 8/2021 | Amos | H01L 23/3677 |
| 11,322,426 B2 | 5/2022 | Malouin, Jr. et al. | |
| 11,439,037 B2 | 9/2022 | Subrahmanyam et al. | |
| 11,594,470 B2 | 2/2023 | Smith et al. | |
| 11,710,678 B2 | 7/2023 | Ganti et al. | |
| 2002/0075651 A1 | 6/2002 | Newton et al. | |
| 2002/0113142 A1 | 8/2002 | Patel et al. | |
| 2004/0051308 A1 | 3/2004 | Coates | |
| 2004/0194492 A1 | 10/2004 | Tilton et al. | |
| 2005/0143000 A1 | 6/2005 | Eisele et al. | |
| 2005/0210906 A1 | 9/2005 | Laufer et al. | |
| 2005/0280994 A1 | 12/2005 | Yazawa | |
| 2006/0042825 A1 | 3/2006 | Lu et al. | |
| 2006/0250773 A1 | 11/2006 | Campbell et al. | |
| 2006/0250774 A1 | 11/2006 | Campbell et al. | |
| 2007/0017659 A1 | 1/2007 | Brunschwiler et al. | |
| 2007/0091569 A1 | 4/2007 | Campbell et al. | |
| 2007/0121294 A1 | 5/2007 | Campbell et al. | |
| 2007/0121299 A1 | 5/2007 | Campbell et al. | |
| 2007/0221364 A1 | 9/2007 | Lai et al. | |
| 2007/0272392 A1 | 11/2007 | Ghosh et al. | |
| 2007/0274045 A1 | 11/2007 | Campbell et al. | |
| 2007/0295480 A1 | 12/2007 | Campbell et al. | |
| 2008/0037221 A1 | 2/2008 | Campbell et al. | |
| 2008/0278913 A1 | 11/2008 | Campbell et al. | |
| 2009/0013258 A1 | 1/2009 | Hintermeister et al. | |
| 2009/0032937 A1 | 2/2009 | Mann et al. | |
| 2009/0284821 A1 | 11/2009 | Valentin et al. | |
| 2009/0294105 A1 | 12/2009 | Sundararajan et al. | |
| 2009/0294106 A1 | 12/2009 | Flotta et al. | |
| 2009/0314467 A1 * | 12/2009 | Campbell | H01L 23/4735 |
| | | | 165/80.4 |
| 2009/0316360 A1 | 12/2009 | Campbell et al. | |
| 2010/0052714 A1 | 3/2010 | Miller | |
| 2010/0276026 A1 | 11/2010 | Powell et al. | |
| 2010/0290190 A1 | 11/2010 | Chester et al. | |
| 2010/0328882 A1 | 12/2010 | Campbell et al. | |
| 2010/0328888 A1 | 12/2010 | Campbell et al. | |
| 2010/0328889 A1 | 12/2010 | Campbell et al. | |
| 2011/0277491 A1 | 11/2011 | Wu et al. | |
| 2012/0048515 A1 | 3/2012 | Bhunia et al. | |
| 2012/0063091 A1 | 3/2012 | Dede et al. | |
| 2012/0160459 A1 | 6/2012 | Flotta et al. | |
| 2012/0212907 A1 | 8/2012 | Dede | |
| 2014/0085823 A1 | 3/2014 | Campbell et al. | |
| 2014/0124167 A1 | 5/2014 | Campbell et al. | |
| 2014/0126150 A1 | 5/2014 | Song et al. | |

(56) References Cited

U.S. PATENT DOCUMENTS

| | | |
|---|---|---|
| 2014/0158326 A1 | 6/2014 | Lyon |
| 2014/0190668 A1 | 7/2014 | Joshi et al. |
| 2014/0204532 A1 | 7/2014 | Mehring |
| 2014/0205632 A1 | 7/2014 | Gruber et al. |
| 2014/0264759 A1 | 9/2014 | Koontz et al. |
| 2014/0284787 A1 | 9/2014 | Joshi |
| 2014/0293542 A1 | 10/2014 | Vetrovec |
| 2014/0352937 A1 | 12/2014 | Draht |
| 2015/0043164 A1 | 2/2015 | Joshi |
| 2015/0096722 A1 | 4/2015 | Zweiback et al. |
| 2015/0131224 A1 | 5/2015 | Barina et al. |
| 2015/0208549 A1 | 7/2015 | Shedd et al. |
| 2016/0013115 A1 | 1/2016 | Vadhavkar et al. |
| 2016/0014932 A1 | 1/2016 | Best et al. |
| 2016/0020160 A1 | 1/2016 | Buvid et al. |
| 2016/0120058 A1 | 4/2016 | Shedd et al. |
| 2016/0143184 A1 | 5/2016 | Campbell et al. |
| 2016/0278239 A1 | 9/2016 | Chainer et al. |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 | 1/2018 | Wakino et al. |
| 2018/0040538 A1 | 2/2018 | Schuderer et al. |
| 2018/0090417 A1 | 3/2018 | Gutala et al. |
| 2018/0124949 A1 | 5/2018 | Marroquin et al. |
| 2019/0013258 A1 | 1/2019 | Malouin, Jr. et al. |
| 2019/0029105 A1 | 1/2019 | Smith et al. |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2020/0006197 A1 | 1/2020 | Hart et al. |
| 2020/0011620 A1 | 1/2020 | Sherrer et al. |
| 2020/0015383 A1 | 1/2020 | Gao |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1 | 7/2020 | Nakashima et al. |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1* | 10/2020 | Chiu .................. H01L 23/473 |
| 2020/0350231 A1 | 11/2020 | Shen et al. |
| 2021/0134703 A1 | 5/2021 | Malouin, Jr. et al. |
| 2021/0265240 A1 | 8/2021 | Smith et al. |
| 2021/0351108 A1 | 11/2021 | Diglio et al. |
| 2022/0151097 A1 | 5/2022 | McManis et al. |
| 2022/0230937 A1 | 7/2022 | Malouin et al. |
| 2022/0253112 A1* | 8/2022 | Hinton ............... H01L 23/3672 |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

* cited by examiner

FLOW-THROUGH, HOT-SPOT-TARGETING IMMERSION COOLING ASSEMBLY

FIELD OF INVENTION

The present invention relates to immersion cooling systems for managing heat in computer electronic devices, and more particularly to immersion cooling assemblies designed to target and cool hot spots in such computer electronic devices.

BACKGROUND

Electronics in cloud data center, blockchain, artificial intelligence, edge, and other computing applications are proliferating as the world continues its digital transformation. As these areas become more popular, end-users are seeking greater computational throughput in smaller size footprints to enable innovation in machine learning, financial services, life sciences, bitcoin mining, oil and gas prospecting, scientific computing, and other applications.

An important challenge that arises from increasing computational throughput is the management of heat in computing electronics. Traditionally, air cooling via computer room air conditioners (CRACs), computer room air handlers (CRAHs), and other such equipment has been used to maintain safe operating temperatures of computing electronics. However, as the thermal footprints have increased with higher computational throughput, air cooling has become a challenge due to air's limited heat transfer characteristics, making for energy- and space-inefficient thermal management infrastructure.

The situation has spurred the use of liquid cooling in computing electronics. One popular technique for liquid cooling is using liquid cold plates, in which electrically conductive coolants with high heat transfer parameters circulate in a closed loop system to remove heat from heat-generating components. The liquid cold plates are typically attached to higher power components (e.g. CPUs, GPUs) via thermal interface materials (TIMs), while low power components often still rely on fans and air cooling. These cold plates often contain internal structures, such as microchannels to allow for very high effectiveness convection at the point of load and can even target device hot spots using preferential flow configurations. While liquid cold plates are one option for cooling of high power components, there can be reliability risks with corrosion and fouling, and any leaks of the electrically conductive coolant may result in server downtime and safety hazards.

An alternative liquid cooling technique that has gained traction in addressing liquid cooling issues is immersion cooling. In immersion cooling, computing electronics are submerged in a container of dielectric coolant, allowing for all electronics on a circuit board to be in intimate contact with a liquid coolant with much reduced risk of damage. For low power components, direct convection with the surrounding fluid is often adequate for maintaining safe temperatures, while higher power components often have a conductive heat sink attached via a thermal interface material to enhance the surface area available for cooling. Immersion cooling has numerous benefits, including but not limited to: highly energy efficient operation (low PUE), improved heat management performance over air cooling, low fan vibrations and noise, low dust/moisture/oxidation risks, and modular deployment capability.

FIG. 1 shows a conceptual, schematic diagram illustrating a current state of the art immersion bath according to the prior art. The dielectric fluid (110) is cycled through a bath (101) by an external pump (102) and is cooled by an external heat exchanger (103). A primary heat-generating component (104) is mounted on a server within the bath (101). The primary heat-generating component (104) may be, for example, a semiconductor die forming part of a processor assembly. A standard heat sink (105) is in thermal communication with the primary heat-generating component (104) through a layer of thermal interface material (106). Heat spreads through the heat sink (105) and is transferred into the dielectric fluid (110) via natural or gentle forced convection, warming the dielectric fluid (110) in the bath (101). The dielectric fluid (110) also circulates to remove heat from other, secondary heat-generating electronic components, depicted collectively as (107), which may be lower in power or power density compared to the primary heat-generating component (104). Operationally, the cooled dielectric fluid (110) first enters the bath (101) (indicated by arrow 113) to remove heat from the primary heat-generating component (104) and other heat-generating electronic components (107). The heated flow (indicated by arrow 111) then enters the pump (102), where it is then routed through flow path (112) into the heat exchanger (103). The warm dielectric fluid 110 is chilled back down for re-entry into the bath (101) by the heat exchanger (112) via a facility chilled-water supply or liquid-air heat exchanger, for example. Other configurations are, of course, possible.

There are a number of current challenges that are limiting the growth potential of immersion cooling. For high power components, many thermal interface materials used to attach heat sinks in ambient air environments are incompatible with submerged dielectric environments. These incompatibility issues result in deterioration in performance over operating lifetime, as the TIMs tend to leach out into the dielectric coolant and reduce the thermal contact between the component and the heat sink. In short, TIMs introduce reliability and yield concerns when used in a liquid immersion environment.

Additionally, although dielectric coolants typically have better thermal characteristics compared to air, they still lag behind electrically conductive coolants by a factor of 3-10× in heat transfer characteristics. Typical immersion applications comprise a pump that provides a very gentle macro flow of coolant in the container, in contrast to the targeted local flow of a liquid cold plate, for example. These factors result in a limitation in thermal performance for cooling of emerging electrical devices with higher and higher thermal design powers (TDPs), as well as devices containing high thermal power density regions (hot spots).

Further, the requirement to use area enhancing heat sinks results in space inefficiency and limited material choices. Even heat sinks that fit within a 1 rack unit height typically extend beyond the planar footprint of the device, thereby requiring a certain level of spacing between components. Further, because these heat sinks must be thermally conductive to allow for adequate heat spreading, they are typically limited to be made from copper or aluminum in metal forming processes, in contrast to lower cost and higher sustainability polymer components, for example.

It would, therefore, be useful to have a heat management technique that addresses some of the key disadvantages associated with conventional methods and techniques for immersion cooling, such as unreliability, via limited material longevity of thermal interface materials; poor performance scaling, via thermal challenges with increasing thermal power components with high thermal density hot spots; size inefficiency, via reliance on heat sinks that employ area enhancement; and unsustainable material usage, via the selection of high conductivity metals in heat sinks. A high reliability, high performance, small sized, and material flexible heat sink would expand the reach of immersion cooling for proliferating computing applications.

SUMMARY

In a variety of embodiments, a flow-through, hot-spot-targeting immersion cooling assembly addresses and overcomes the challenges and disadvantages associated with conventional immersion cooling in computing applications. The assembly comprises at least one primary heat-generating component, a cooling surface in thermal communication with the at least one primary heat-generating component, and a flow-through cooling module mounted in close proximity to the at least one primary heat-generating component. The flow-through cooling module comprises at least one inlet conduit to accept an inflow of pressurized dielectric coolant, a fastener for attaching the flow-through cooling module to the cooling surface, a fluid chamber through which fluid flows to provide targeted, direct cooling to a heat-generating component, and exit passageways to facilitate flow-through of the dielectric coolant into the surrounding immersion bath for cooling of other components. In certain embodiments, the assembly may also comprise at least one periphery heat-generating component, which may be also be cooled by the dielectric coolant as it exits the vicinity of the flow-through cooling module. In one embodiment, a heat-generating semiconductor die for a processing unit is disposed on a circuit board, assembled and in thermal communication with a first surface of an integrated heat spreader. A flow-through cooling module is mounted to a server circuit board via standard heat sink fastener locations. The flow-through cooling module, with its inlet conduit, accepts pressurized dielectric coolant and facilitates direct fluid contact with a second surface of the integrated heat spreader, opposite the first, with no thermal interface material (TIM). The dielectric coolant removes heat from the semiconductor die via the integrated heat spreader and passes out of the flow-through cooling module via the exit passageways. At steady-state, the entire server volume is immersed in dielectric coolant. The dielectric coolant passing through the exit passageways of the flow-through cooling module emerges into the surrounding server volume, circulating throughout the immersed server volume to continue removing heat from periphery components, such as voltage regulators or memory cards, before returning to a pump supply and ambient heat exchanger. The coolant is chilled and re-pressurized for delivery back to the flow-through cooling module for continuous operation.

Using this flow-through, hot-spot-targeting immersion cooling assembly, many of the thermal management challenges of immersion cooling systems are addressed. First, as there is no TIM exposed to the dielectric coolant, challenges relating to poor reliability from TIMs is mitigated. The flow-through cooling module causes pressurized coolant to flow directly to and over the heat-generating component, so that highly effective cooling can be achieved without using a finned metal heat sink. This arrangement saves space and material as the overall footprint of the cooling components may be reduced and the full volume around the processor need not be occupied by the conductive metal heat sink. Further, with more intimate fluid contact with the device, more heat can be shed, and hot spots can be more effectively targeted to reduce overall device operating temperatures. Finally, as the flow-through cooling module facilitates direct fluid contact with the cooling surface, it performs no heat transfer and therefore can be made from non-thermally conductive materials. This may open the material landscape to more sustainable materials that are traditionally unavailable in heat transfer systems.

In another embodiment, the flow-through cooling module is configured to cool down heat-generating components using jet impingement convection. In this embodiment, the assembly comprises at least one primary heat-generating component, at least one periphery heat-generating component, a cooling surface in thermal communication with the at least one primary heat-generating component, and a flow-through cooling module. The cooling module comprises at least one inlet conduit to accept pressurized dielectric coolant, a fastener to fasten the cooling module to a printed circuit board, a first fluid chamber in fluid communication with the at least one inlet conduit and bounded by a first surface, a second fluid chamber through which fluid flows to provide targeted, direct cooling to the heat-generating component bounded by a second surface spaced from the first surface, nozzles spanning the first and second surfaces providing fluid transmission from the first fluid chamber to the second fluid chamber, and exit passageways to facilitate flow-through of the dielectric coolant into the surrounding immersion bath for cooling of other components.

This embodiment also addresses many of the thermal management challenges of immersion cooling systems. For example, because there is no TIM, reliability is improved. Even greater effectiveness cooling can be achieved using impinging jets to elevate thermal design power and manage heat at high power density hot spots. It is compact as it does not rely on heat spreading to spread heat into a large heat sink. It is also allows for sustainable material selection as the cooling module structure does not participate in the thermal pathway of the heat removal.

These and other embodiments provide an opportunity for improved immersion cooling systems for thermal management of high power electronics for the future of many computing applications.

BRIEF DESCRIPTION OF THE DRAWINGS

For a better understanding of the present disclosure, reference is made to the accompanying drawings, in which.

DETAILED DESCRIPTION OF EMBODIMENTS

More detailed descriptions of a variety of different embodiments of the flow-through, hot-spot-targeting immersion cooling assembly will now be presented. Not all possible embodiments will be disclosed and described, which those skilled in the art will recognize. Note that for all disclosed figures, unless otherwise specified, the operating environment comprises a bath of dielectric coolant.

In many cases the electronics may be fully surrounded by dielectric coolant, though partial or intermittent submergence is possible. Certain figures may show full or partial immersion for clarity of description. Further, items are not necessarily to scale or exact form factor for compactness.

Figure 1:
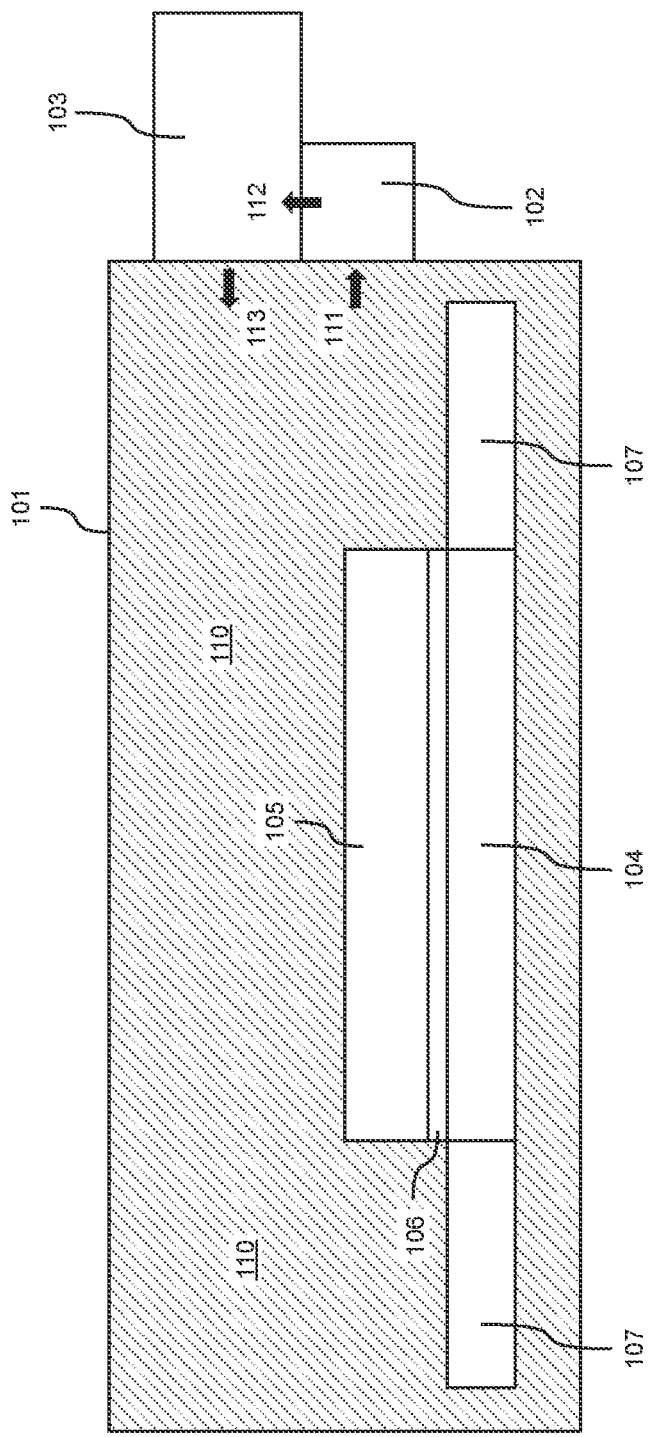
FIG. 1 is a conceptual, schematic diagram illustrating a dielectric cooling assembly according to the prior art.
Figure 2:
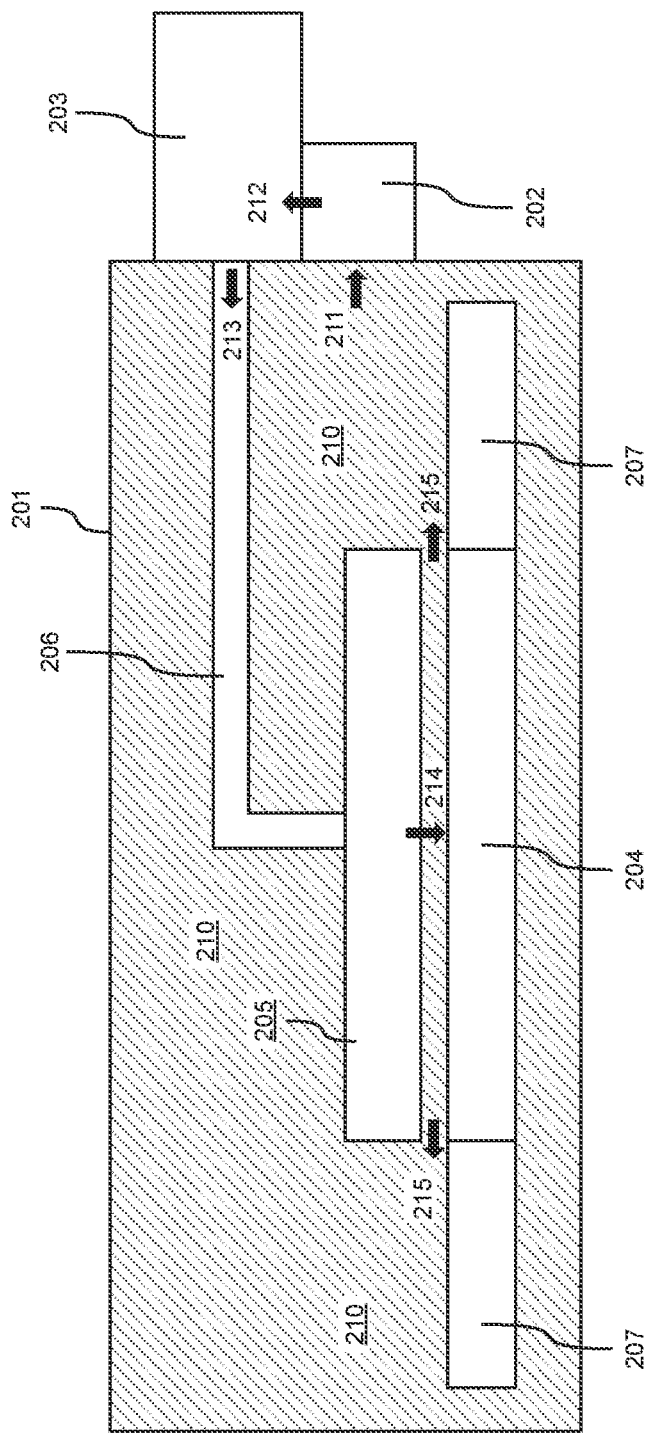
FIG. 2 is conceptual, schematic diagram of an embodiment of a flow-through, hot-spot-targeting dielectric cooling assembly in accordance with one embodiment of the claimed invention.

FIG. 2 illustrates conceptually and schematically an immersion bath utilizing flow-through immersion cooling modules, which are the focus of the present disclosure. The dielectric fluid (210) is cycled through the bath (201) by an external pump (202) and is cooled by an external heat exchanger (203). A primary heat-generating component (204) is mounted on a server within the bath (201). The primary heat-generating component (204) may be, for example, a semiconductor die forming part of a processor assembly, such as a central processing unit (CPU), graphics processing unit (GPU), application-specific integrated circuit (ASIC), field-programmable gate array (FPGA), or other. The semiconductor may commonly be made from silicon, but may also be made from Gallium Arsenide, Gallium Nitride, Silicon Carbide, or other such semiconductor materials. A flow-through cooling module (205) is mounted in close proximity to the primary heat-generating component (204) and does not require a thermal interface material. In contrast to current state of the art immersion baths, newly chilled dielectric fluid (210) is pumped through a tube (206) directly to the cooling module (205), such that the first time the dielectric fluid (210) is introduced into the bath (201) is through the cooling module (205), which is located in very close proximity to the primary heat-generating component on the server board. Therefore, the flow-through cooling module (205) facilitates more immediate intimate contact between the chilled dielectric fluid (210) and the primary heat-generating component (204). Due to the intimate contact between the chilled dielectric fluid (210) and the primary heat-generating component (204), some of the heat generated by the primary heat-generating component (204) is absorbed by the chilled dielectric fluid (210), thereby raising the fluid's internal temperature. The now heated dielectric fluid (210) then exits the vicinity of the flow-through cooling module (205), thereby carrying heat away from the primary heat-generating component (204) and into the surrounding bath (201). As the heated dielectric fluid (210) exits the vicinity of the flow-through cooling module (205) and the primary heat-generating component (204), it flows over, interacts with, and cools other, secondary heat-generating electronic components (collectively referenced as 207). The other, secondary heat-generating electronic components (207) may comprise, for example, memory chips, DIMMs, voltage regulator modules, power conversion electronics, power supplies, capacitors, processors, or other such heat-generating components common to server boards. As these secondary heat-generating electronic components (207) may be lower in power or power density compared to the primary heat-generating component (204) and therefore they generate less heat, utilizing the heated dielectric coolant (210) emerging from the vicinity of the flow-through cooling module (205) can provide adequate cooling for the other, secondary heat-generating electronic components (207).

Operationally, the chilled dielectric fluid (210) first enters the tube (206) (indicated by arrow 213), which carries the chilled dielectric fluid (210) to the flow-through cooling module (205), which directs the chilled dielectric fluid (210) to flow over the surfaces of the primary heat-generating component (204) to remove heat from the primary heat-generating component (204). The flow first exits the flow-through cooling module (205) (indicated by arrow 214) to facilitate intimate fluid contact with the primary heat-generating component (204). The flow then exits the vicinity of the flow-through cooling module (205) (indicated by arrows 215) and flows to cool other heat-generating electronic components (207). The heated flow (indicated by arrow 211) then enters the pump (202), where it is then routed into the heat exchanger (203) as indicated by arrow 212. The warm dielectric fluid (210) is chilled back down for re-entry into the bath (201) by the heat exchanger (203) via a facility chilled-water supply or liquid-air heat exchanger, for example.

Figure 3:
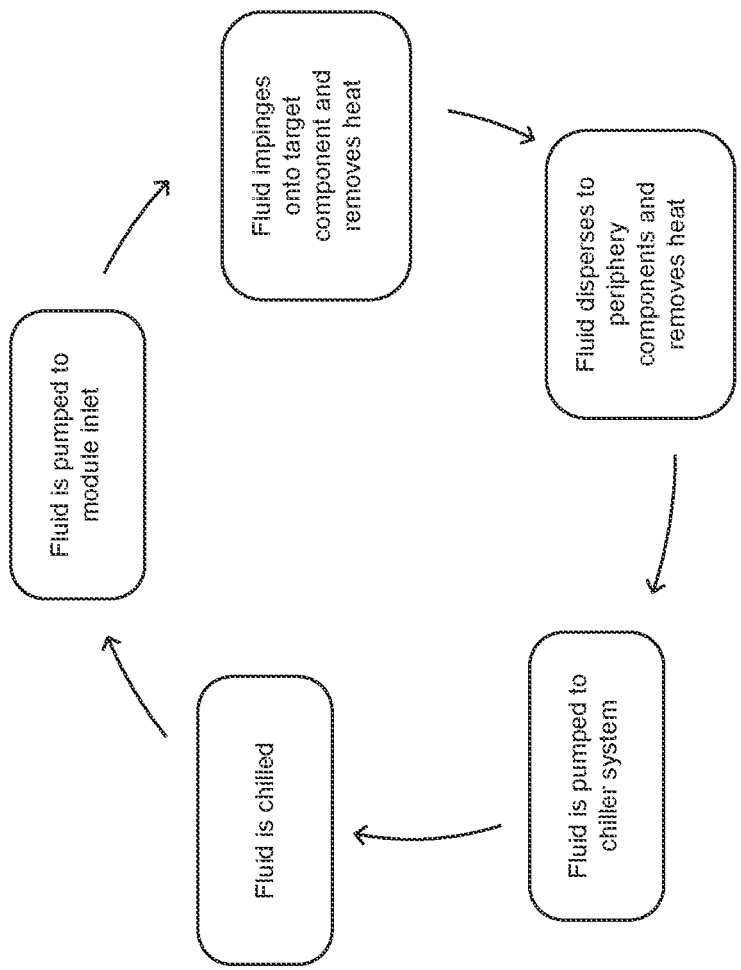
FIG. 3 is a flowchart illustrating the cooling cycle implemented using a flow-through, hot-spot-targeting dielectric cooling assembly as illustrated in FIG. 2.

Alternatively, although not illustrated in FIG. 2, the pump (202) could be located downstream of the heat exchanger (203) so that the heated coolant fluid drawn from the dielectric bath (210) flows into the heat exchanger (203) before it flows into the pump (202). Regardless of the whether the heated coolant flows into the pump before it flows into the heat exchanger, or otherwise flows into the heat exchanger before the pump, the pump and the heat exchanger cooperate with each other to draw coolant fluid from the dielectric bath of the container, and cool the coolant fluid before transferring the cooled coolant fluid back to the inlet conduit of the cooling module. Other configurations are, of course possible. This cyclic process is illustrated by the high-level flowchart shown in FIG. 3.

The dielectric fluid (210) may take on a variety of forms. It may be a synthetic oil (e.g., polyalphaolefin (PAO)), a fluorinated fluid (e.g., Fluorinert™ from 3M), a mineral oil (e.g. paraffin oil), a silicone oil, or other dielectric coolants. It may operate in a single-phase operation, or it may undergo phase change as it cycles through the cooling process.

Figure 4:
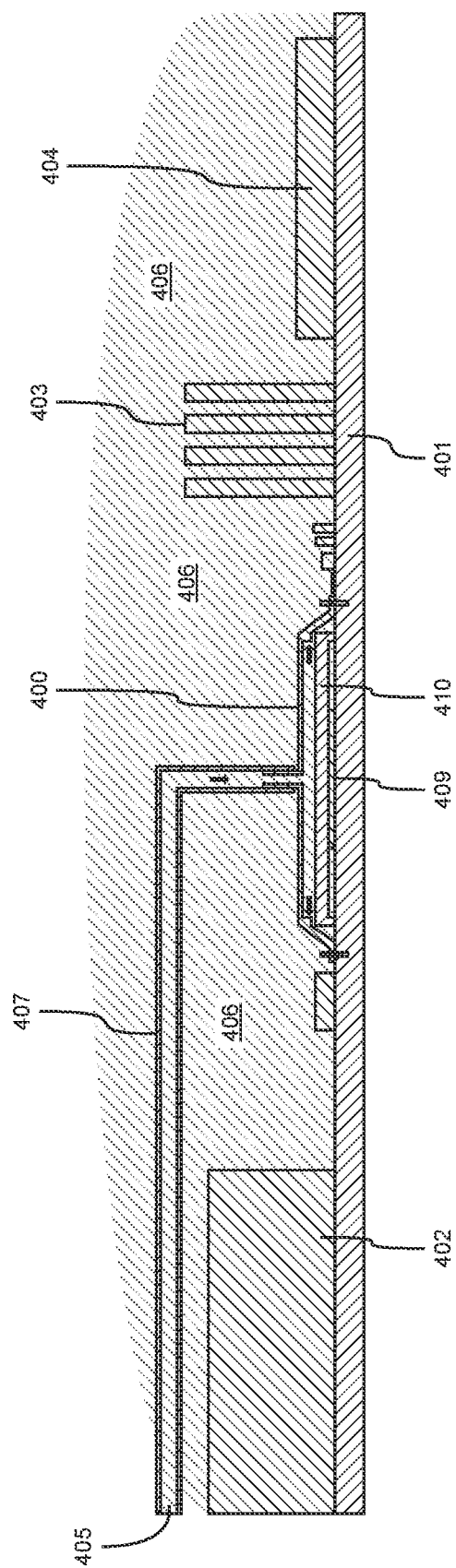
FIG. 4 is a schematic, system-level section diagram of a flow-through, hot-spot-targeting cooling assembly with a primary heat-generating component and various secondary heat-generating components.

There are many possible embodiments of the flow-through, hot-spot-targeting immersion cooling assembly. FIG. 4 illustrates one possible electronics assembly-level integration of such an embodiment. As shown in FIG. 4, the flow-through cooling module (400) is disposed on a circuit board (401). Other components may be disposed on the circuit board (401) next to the module assembly (400), including, for example, a power supply (402), memory cards (403), and a disk drive (404). There are other possible components, such as voltage regulators, for example, which could be disposed on a server circuit board not included in FIG. 4. The fluid inlet (405), attached to a pump (not shown in FIG. 4), heat exchanger (not shown), or other fluid connection, delivers freshly chilled coolant to a cooling surface (410) that is in thermal communication with a primary heat-generating component (409) through tube (407). The tube (407) could be arranged such that hot swap is possible, or simply detached when maintenance is required. After removing heat from the primary heat-generating component (409), fluid flows out from under the flow-through cooling module (400) through outlet apertures or gaps (best illustrated in FIGS. 6A, 6C and 6D, described in more detail below) formed between lower edges of the cooling module body and the surface of the circuit board (401), and into the bath (406). There, the coolant fluid continues removing heat from other powered components (e.g, 402, 403, 404) disposed on the circuit board (401) upon flowing out of the cooling module (400). Thus, the cooling module (400) functions like a shroud disposed over the primary heat-generating electronic component (409), which effectively guides "fresh" (i.e., just-chilled) coolant fluid directly into contact with the cooling surface 410 in thermal communication with the primary heat-generating electronic component (409) and then allows the coolant fluid to seep or spread out from under the shroud to continue cooling other, secondary heat-generating electronic components.

Flow-through, hot-spot-targeting immersion cooling assemblies constructed in accordance with the present invention can be implemented via a number of different embodiments, as illustrated in FIGS. 5-14. Some of those embodiments will now be discussed in greater detail.

Figure 5:
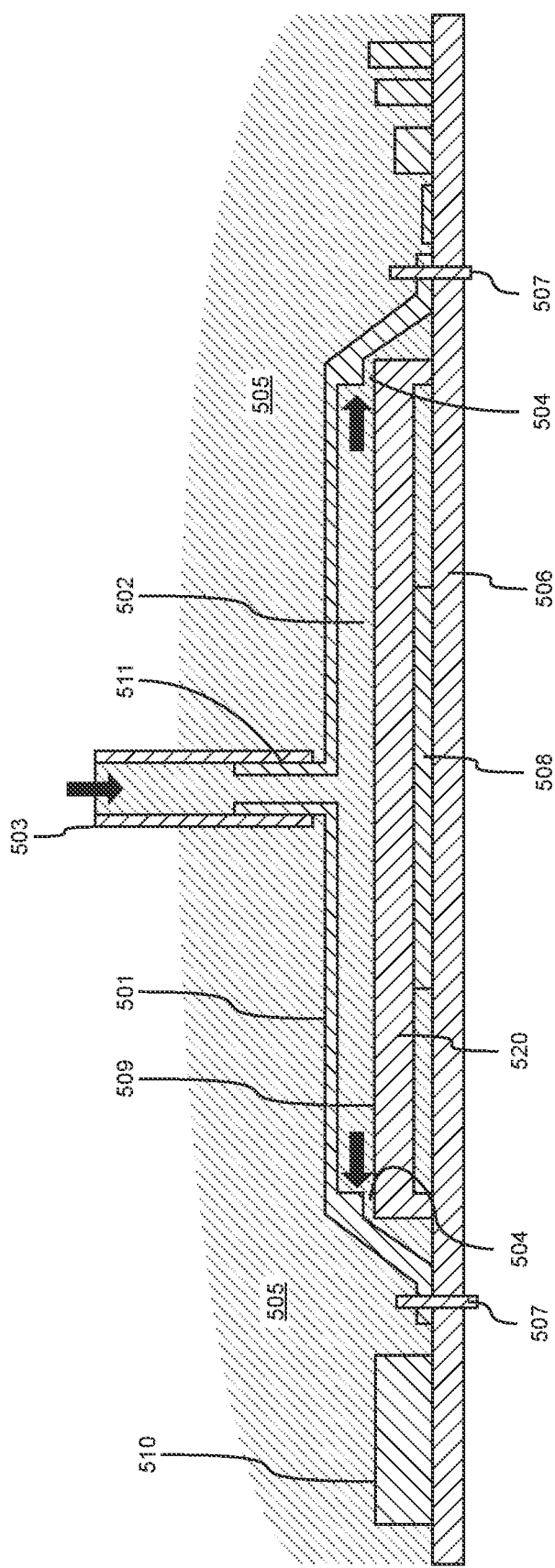
FIG. 5 is a schematic, section diagram illustrating in greater detail the flow-through immersion cooling module used in the cooling assembly shown in FIG. 4.

The exemplary flow-through cooling module (400) illustrated in FIG. 4 is illustrated in greater detail in FIG. 5. In FIG. 5, a heat-generating component (508), such as a silicon die, is disposed on a circuit board (506) within a dielectric bath (505) and in thermal communication with a cooling surface (509), such as that of an integrated heat spreader (520) configured and disposed to absorb and spread or distribute heat generated by the heat-generating component (508). The module (501) includes an inlet conduit (511), which accepts fresh coolant from, for example, an inlet tube (503). Coolant is guided into a fluid chamber (502), which is bounded on one side by the cooling surface (509) and on another side by a surface of the module (501), thereby interacting with the cooling surface (509) and removing heat from it and, hence, from the primary heat-generating electronic component (508). After removing heat from the cooling surface (509), the coolant exits the fluid chamber (502) and flows through outlet passageways (504), then under outlet aperture-forming, spaced edges (not illustrated) of the cooling module as described above, to enter into the dielectric fluid bath (505) and cool secondary heat-generating components (indicated collectively as 510). The module (501) is disposed on the circuit board (506) with fasteners (507) that mechanically fix or attach the cooling module (501) to the circuit board (506). In this case, for example, the fasteners (507) comprise screws or bolts. There are many possible mechanisms to provide mechanical fixing, such as those using screws, clamps, mechanical chassis, solder, adhesives, flexures, springs, multiple mating parts, or other common mechanisms to attach components to printed circuit boards. The fasteners 507 may also provide a force, such as, for example, in the case of a land grid array (LGA) processor assembly, where the processor contacts must be pressed into the socket on the circuit board.

It should be noted that the integrated heat spreader (520) could overlie and contact multiple dies of varying power density, as illustrated in further embodiments described below. There may be other secondary heat-generating components (510) also disposed on the circuit board (506). It should also be noted that, in alternative embodiments, the cooling module may comprise at least one side wall having one or more openings or notches therethrough, wherein the one or more openings or notches are configured to form the exit apertures when the cooling module is mounted to the circuit board.

Figure 6A:
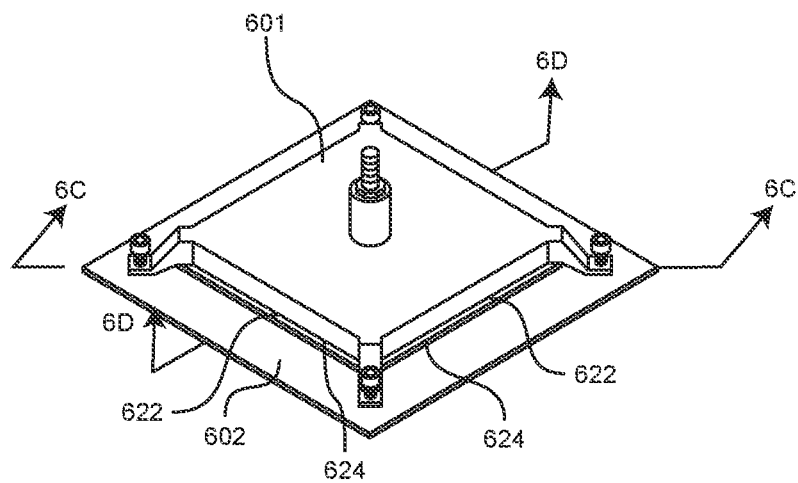
FIGS. 6A, 6B, 6C and 6D show, respectively, isometric, isometric exploded, and two isometric section views illustrating a flow-through, hot-spot-targeting cooling assembly containing a flow-through cooling module attached to a printed circuit board, with the view in FIG. 6C being sectioned along the cutting line 6C-6C in FIG. 6A, and the view shown in FIG. 6D being sectioned along the cutting line 6D-6D in FIG. 6A.
Figure 6B:
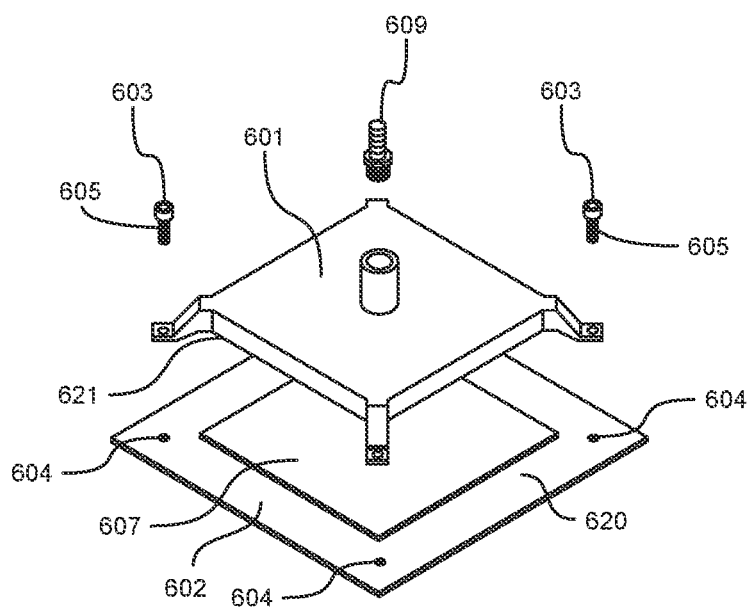
Figure 6C:
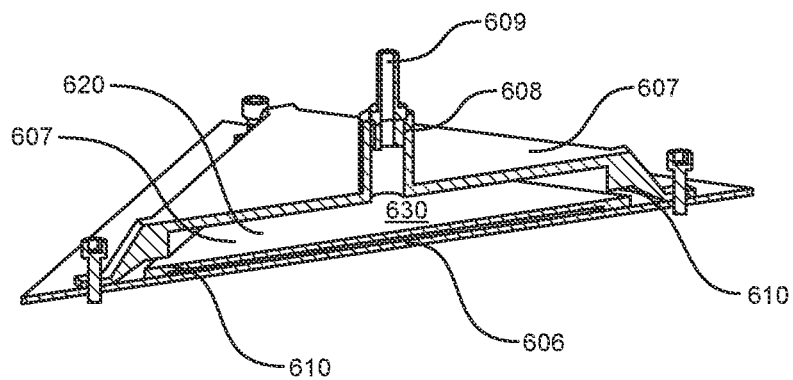

A flow-through immersion cooling module, like the cooling module (501) used in the embodiment illustrated in FIG. 5, is illustrated in greater detail in FIGS. 6A (isometric view), 6B (isometric exploded view), 6C (isometric sectional view) and 6D (another isometric sectional view). As illustrated in these figures, the module (601) is disposed on a circuit board (602) with mechanical fasteners (603), e.g., screws threaded into fastener holes (604) in the PCB. Furthermore, compression springs (605) may be provided surrounding the screws (603) to prevent overtightening of the attachments, as is standard with many heat-sink circuit board mounts. The module (601) could have more or fewer mount connections than the four shown, if found to be structurally appropriate. Also disposed on the circuit board (602) is a primary heat-generating electronic component (606) (FIG. 6C), such as a semiconductor die, and a corresponding cooling surface (607), such as that of the integrated heat spreader (620). It should be noted that there may be a thermal interface material to ensure continuous thermal contact between the die and integrated heat spreader (620), although it is not shown in FIG. 6C. However, there is no thermal interface material disposed between the cooling surface (607) and the cooling module (601). The inlet conduit (608) may include, for example, a barbed fitting (609) for connection of a tube to receive fresh, newly cooled coolant fluid from the fluid supply (not shown). Those familiar with the art will recognize and appreciate that the inlet conduit (508) may comprise a variety of alternative types of fittings, including without limitation, push-to-connect fittings, compression fittings, crimp fittings, welds, or other types of fittings.

Figure 6D:
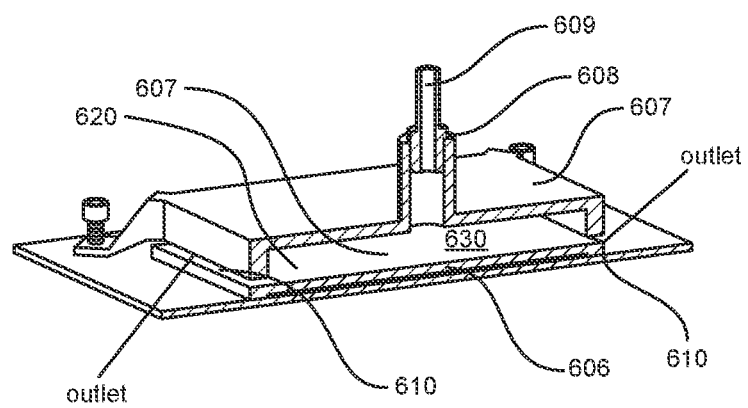
Figure 7:
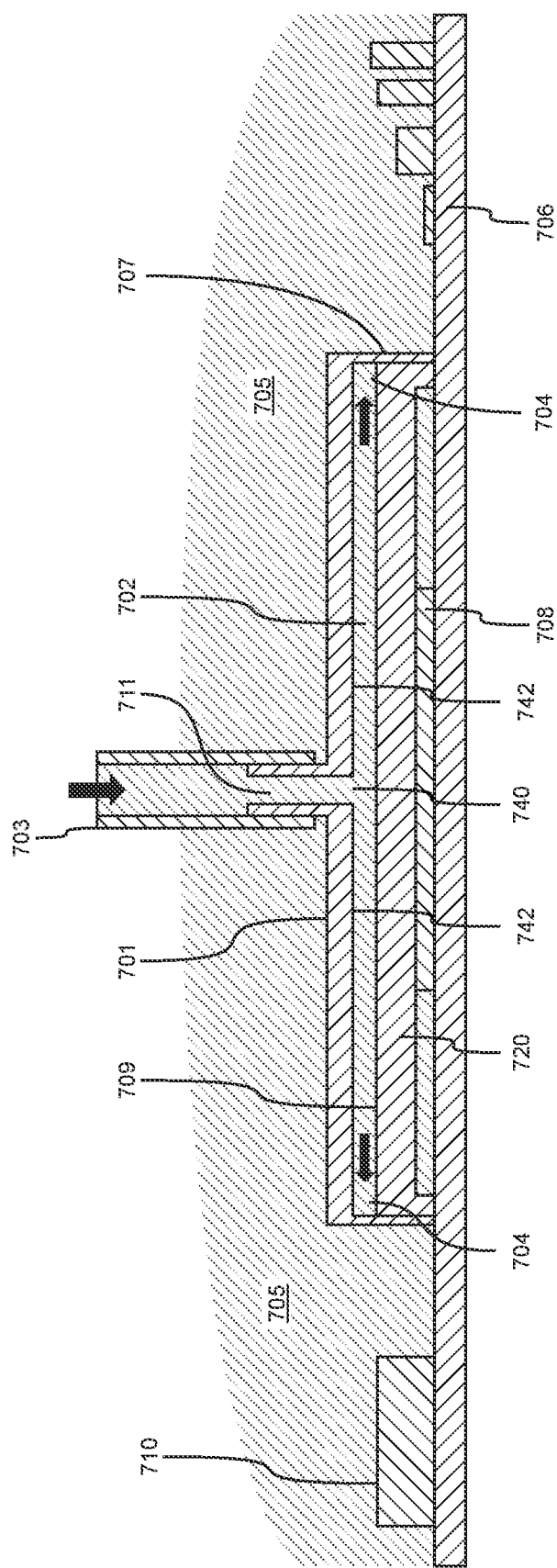
FIG. 7 is a schematic diagram, in section, illustrating another embodiment of a flow-through immersion cooling module.

The outlet aperture (610) is open to and in communication with the surrounding fluid, such that coolant fluid will disperse into the surrounding bath to cool secondary heat-generating components (not shown) after absorbing heat from the primary heat-generating electronic component (606). In other words, as explained above, fluid flows under lower edges of the module (601), which are spaced apart from the surface of the printed circuit board (602) to form outlet apertures (gaps). Of the various figures in this disclosure, this concept is best illustrated in FIGS. 6A-6D. Thus, as illustrated in these figures, the mount connections are formed like downwardly extending legs or stand-offs, e.g., at the corners of the module (601). As a result, the lower edges (622) of the module (601) are spaced slightly apart from the surface of the circuit board (602), thereby leaving slot-shaped outlet apertures (624). Because the section views of the various embodiments illustrated in FIGS. 4, 5, 7, 9, 10, and 12 are taken diagonally through the mount connections of the modules (as in the view shown in FIG. 6C), the outlet apertures in the embodiments illustrated in those figures are not visible. However, FIG. 6D shows another sectioned diagram of the assembly. In FIG. 6D the cut line has been rotated 45 degrees so that the cut line does not pass through any of the standoff mounts in the corners of the cooling module, which better illustrates the gaps located between the lower edges of the cooling module (607) and the integrated heat spreader (620). These gaps comprise the outlet apertures (610) that are used by the coolant fluid to escape the fluid chamber (630). In some embodiments it may be beneficial to make the outlet apertures (labeled as 610 in FIG. 6D, and 502 in FIG. 5) irregular around the perimeter to preferentially direct the outlet flow to nearby components in need of greater cooling Another embodiment of a flow-through immersion cooling module that uses an alternative type of fastener is illustrated in FIG. 7. In this embodiment, a primary heat-generating component (708), such as a silicon die, is disposed on a circuit board (706) within a dielectric bath (705) and in thermal communication with a cooling surface (709), such as that of an integrated heat spreader (720). The module (701) has an inlet conduit (711) which accepts fresh dielectric coolant from, for example, an inlet tube (703), and directs the dielectric coolant to pass through an opening (740) in the a lower surface (742) of the cooling module (701), to enter a fluid chamber (702) that is bounded on one side by the cooling surface (709) and on another side by the lower surface (742) of the cooling module (701). Inside the fluid chamber (702), the coolant interacts with the cooling surface (709) and removes heat from the cooling surface (709) and, hence, from the primary heat-generating component (708). The cooling surface (709) may be a part of the heat-generating component (708) or it may be separate from the heat-generating component (708), as illustrated in FIG. 7, in which the cooling surface (709) is a feature of the integrated heat spreader (720). After removing heat from the cooling surface (709), the coolant exits the fluid chamber (702) and flows through outlet passageways (704) and outlet apertures (610) (shown best in FIG. 6D) to enter the dielectric fluid bath (705) and cool secondary heat-generating components (collectively indicated as 710).

In this embodiment, the module (701) is fastened to the integrated heat spreader (720) with a fastener (707), which may comprise, for example, an adhesive or a snap/interference fit with the sides of the heat spreader (720). Other fastening or attachment options may include without limitation solder, brazing, welding, chemical bonds, or other common affixing techniques. It should be noted that, although not visible given the location of the cutting plane that forms the section view of FIG. 7, the fastener (707) in this embodiment does not extend all the way around the perimeter of the heat spreader (720), thus leaving gaps that function as the outlet apertures to permit flow of dielectric coolant into the immersion bath (705).

Figure 8:
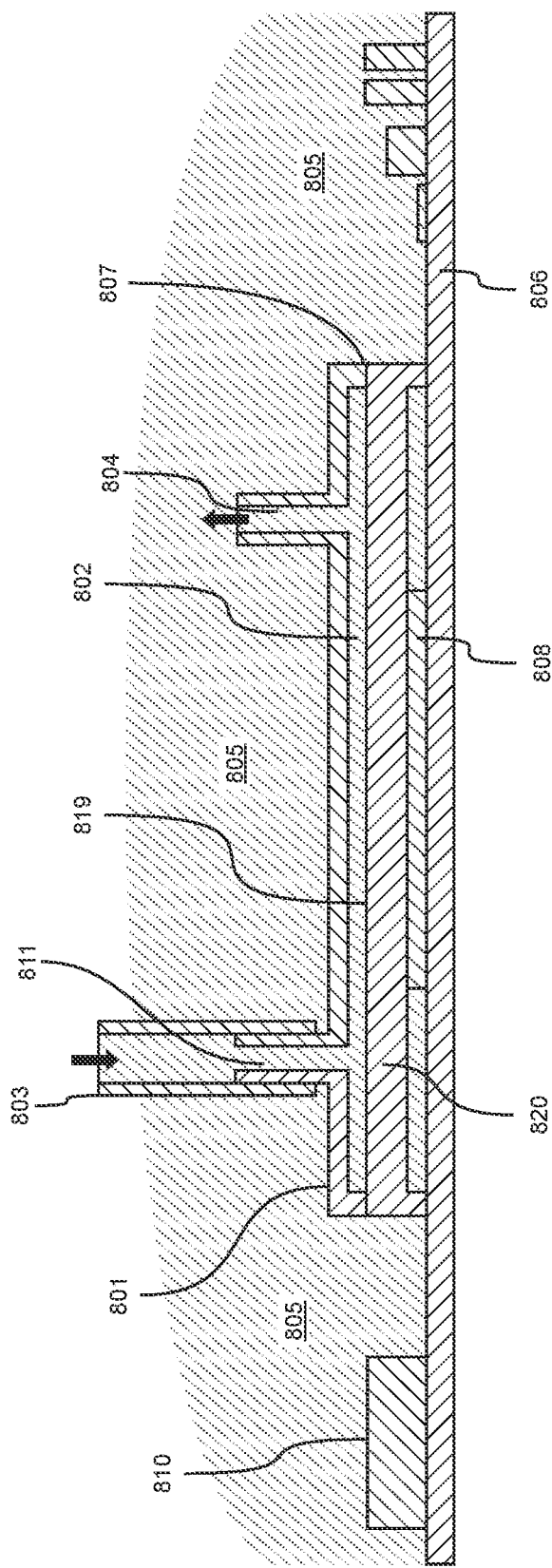
FIG. 8 is a schematic diagram, in section, illustrating a further embodiment of a flow-through immersion cooling module.

FIG. 8 shows an embodiment containing a flow-through immersion cooling module with an alternative outlet configuration that does not rely on flow under lower edges of the cooling module or through slot-shaped outlet apertures as in the embodiments described above. In this embodiment, a primary heat-generating component (808), such as a silicon die, is disposed on a circuit board (806) within a dielectric bath (805) and in thermal communication with a cooling surface (809), such as that of an integrated heat spreader (820). The module (801) has disposed within it an inlet conduit (811), which receives fresh, newly chilled coolant from, for example, an inlet tube (803). Coolant is guided into a fluid chamber (802) that is bounded on one side by the cooling surface (809) and on the other side by a surface of the cooling module (801), thereby interacting with the cooling surface (809) and removing heat from it and, hence, from the primary heat-generating electronic component (808). After removing heat from the cooling surface (809), the coolant exits the fluid chamber (802) and flows through a second, outlet passageway (804), this time leaving through an outlet conduit in a direction (e.g., perpendicularly) that leads away from the cooling surface (809). The coolant fluid would still subsequently cool secondary heat-generating components (collectively referenced as 810), but in this case will have had a chance to mix with cooler dielectric fluid in the bath (805) before interacting with the other components (810). In this embodiment, the module (801) may be attached to the heat spreader (820) by an adhesive to form a joint (807). In this case, a fluid-tight seal (or a substantially fluid-tight seal) may be made between the cooling module (801) and the cooling surface (809) of the heat spreader (820) to force coolant fluid to flow out of the cooling module (801) via the outlet passageway (804) (instead of through the joint or interface). In other embodiments, a cooling module of this form (801) may be attached to a fluid conveyance element (such as a tube) that directs egress fluid to another cooling module in a serial configuration.

Figure 9:
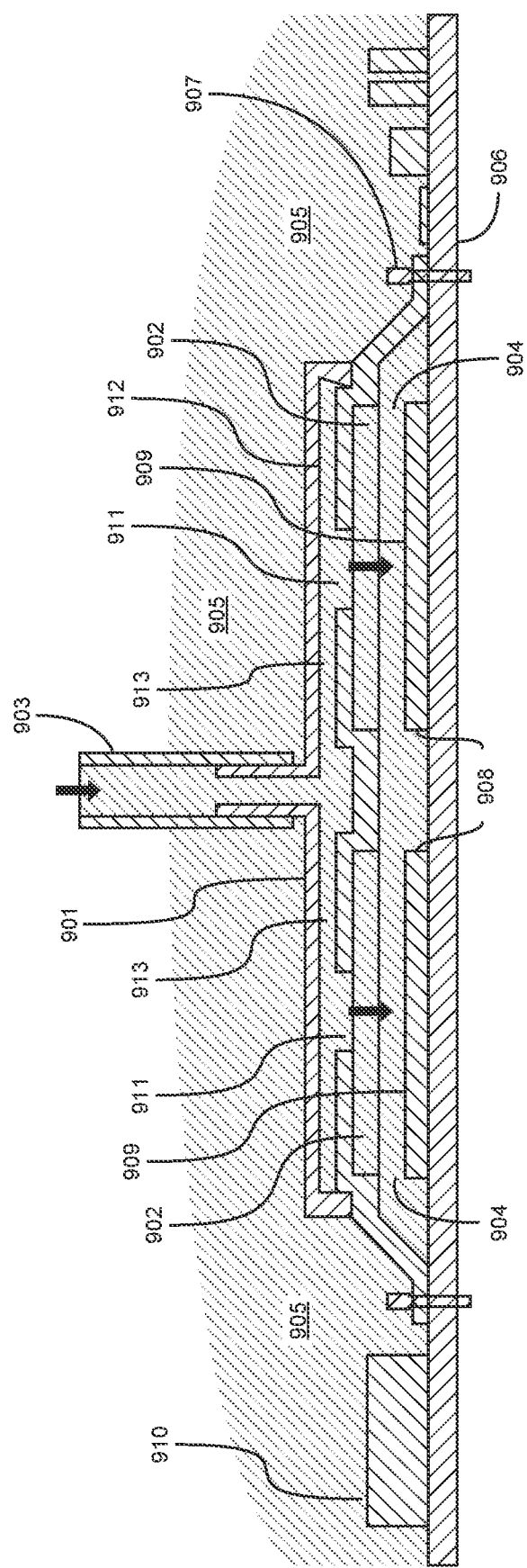
FIG. 9 is a schematic diagram, in section, illustrating a still further embodiment of a flow-through immersion cooling module.

In yet another embodiment, as shown in FIG. 9, the flow-through, hot-spot-targeting immersion cooling module includes a flow distribution reservoir (912) that distributes flow to multiple inlet conduits (911) of the flow-through immersion cooling module (901). The embodiment illustrated in FIG. 9 may be of particular benefit to circuit boards containing arrays of primary heat-generating components (908), such as ASICs for bitcoin mining or multi-die processor assemblies in bare-die CPU and GPU processors.

In this embodiment, the module (901) is disposed on a circuit board (906) with mechanical fasteners (907). Multiple primary heat-generating components (908) are disposed on the circuit board (906), which could be of varying power densities. There may also be other, secondary heat-generating components (collectively indicated as 910) also disposed on the circuit board (906). The flow distribution reservoir (912) has internal fluid passages (913) that guide dielectric fluid from, for example, an inlet tube (903) that receives fresh coolant fluid, to inlet conduits (911) of the module (901). Notably, the inlet conduits (911) are positioned to align with the location of the primary heat-generating electronic components (908) on the circuit board (906). As illustrated in this embodiment, the cooling surfaces (909) may be bare die surfaces in direct thermal communication with embedded heat-generating regions of the die, or they may be the surface of a package such as in an ASIC.

The flow distribution reservoir (912) could be attached to the main body of the module (901) using a fastener, such as screws or bolts, adhesives, a snap-fit or friction-fit connection, solder, brazing, welding, chemical bonds, or similar. Dielectric coolant is guided via the inlet conduits (911) into at least one coolant chamber (902), which coolant chamber(s) (902) is/are bounded on one side by the cooling surfaces (909) and on another side by lower surfaces of the flow distribution reservoir (912), and removes heat from the primary heat-generating electronic components (908) via the cooling surfaces (909). After removing heat from the cooling surfaces (909), the coolant exits the fluid chambers (902) and flows through outlet passageways (904) immediately into the dielectric fluid bath (905).

FIG. 9 illustrates one possible configuration of this embodiment, where the flow distribution reservoir is formed as a separate piece from the flow-through immersion cooling module that is attached using a suitable fastener. There may, of course be other configurations, such as those made of a unitary structure or even those in more than two pieces. Furthermore, the overall electronics assembly may include many more than two primary heat-generating components, e.g., on the order of sixty or even one hundred such heat-generating components. The flow distribution reservoir and flow-through cooling module may be configured accordingly to accommodate large numbers of primary heat-generating components, e.g., using additional fasteners or being split into more pieces to be assembled together, for example.

With arrays of heat-generating devices, managing the heated fluid is an important part of maximizing performance. Therefore, the flow distribution reservoir may be configured such that cool fluid received directly from the heat exchanger is separately delivered to each heat-generating device instead of, for example, a serial configuration in which certain primary heat-generating components receive the heated "exhaust" coolant from other, "upstream" primary heat-generating components. To this end, the outlet passageways or other fluid flow enhancement features may be configured such that there is automatic purging of heated exhaust away from other primary heat-generating components. In two-dimensional device arrays, exhaust alleyways may be established such that all of the heated exhaust joins together and exits in a controlled manner, while all of the coolant supply may be delivered in a neighboring alleyway so as to provide uniform chilled coolant temperature to each device (like the hot/cold aisle structure of a data center). Because the performance of electronics systems is frequently limited by the hottest components or sections thereof, these hot-spot-targeting and uniform-temperature coolant delivery features may provide for more efficient and higher-reliability systems.

Figure 10:
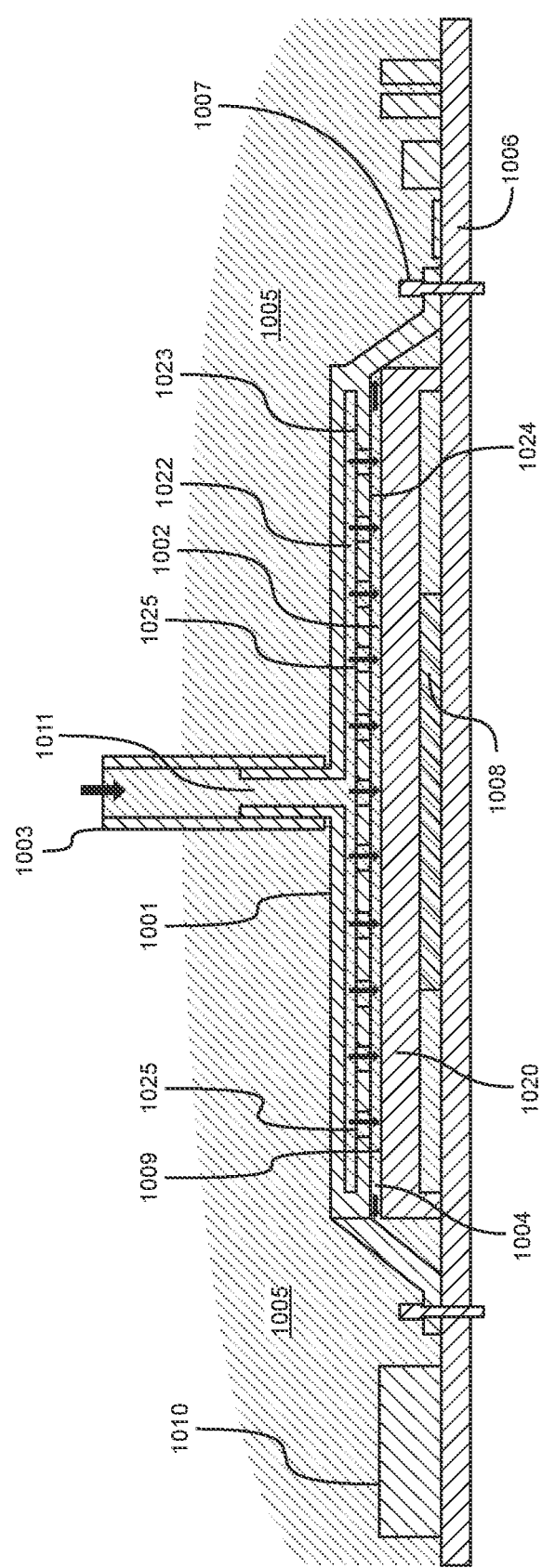
FIG. 10 is a schematic diagram, in section, illustrating a further embodiment of a flow-through immersion cooling module, which embodiment incorporates jet impingement nozzles.

Another embodiment of a flow-through immersion cooling module, which utilizes a different arrangement to bring coolant into contact with the cooling surface of the primary heat-generating electronic component, is illustrated in FIG. 10. In this embodiment, the fluid-delivery arrangement includes a jet-impingement immersion cooling module (1001). Jet impingement operates on the principle of passing coolant fluid through small nozzles to accelerate the flow and generate substantially continuous "jets" of coolant fluid in a concentrated direction. Thus, after passing through the small nozzles, the coolant fluid may be flowing at rates in the range of 1-25 m/s, as compared to flow rates in the range of 0.1-2.5 m/s before passing through the nozzles. When impinging on a heated surface, especially in a substantially perpendicular orientation, these concentrated jets of coolant act to provide enhanced convection heat transfer. This occurs due to a phenomenon known as boundary layer suppression, where the momentum of the accelerated coolant causes the chilled coolant fluid to be in intimate, close contact with the heated surface, which corresponds to high heat removal capability.

Thus, in the embodiment illustrated by FIG. 10, a primary heat-generating electronic component (1008), such as a silicon die, is disposed on a circuit board (1006) within a dielectric bath (1005) and in thermal communication with a cooling surface (1009), such as that of an integrated heat spreader (1020). A jet-impingement immersion cooling module (1001), comprising a plurality of jet impingement nozzles (1025), is disposed in close proximity to the cooling surface (1009) of the integrated heat spreader (1020). Freshly cooled coolant fluid is directed through the plurality of jet impingement nozzles (1025) at a relatively high velocity flow to directly contact the cooling surface (1009) of the integrated heat spreader (1020) to absorb and remove heat from the cooling surface (1009).

As compared to an arrangement that uses parallel and/or low velocity flow across the cooling surface, and/or other arrangements in which the coolant fluid directly adjacent to the heated surface undergoes a significant rise in temperature, and therefore makes for less efficient heat transfer, the jet impingement immersion arrangement may provide better heat-transfer between the cooling surface (1009) of the integrated heat spreader (1020) and the coolant fluid as the coolant fluid is dispersed over the cooling surface (1009) by the multiplicity of impingement jets (1025). For example, the jet impingement immersion arrangement may be more effective at cooling electronic components than spray cooling. Unlike jet impingement immersion cooling, which uses jet nozzles to direct concentrated streams (i.e., jets) of coolant fluid onto the heated surface at high velocity, spray cooling uses atomizers or sprayers to produce and distribute a set of small, individually formed droplets atop the heated surface. These droplets eventually cool the heated surface by undergoing a phase change (vaporization of the droplets) caused by contact with the heated surface. In spray cooling, the atomizers or sprayers are typically configured to disperse the coolant droplets in a wide pattern and contact the heated surface over a wide area, whereas the coolant fluid dispersed by jet impingement nozzles is dispersed at high velocity, in a substantially continuous, and more concentrated pattern, and contact the heated surface in a smaller area.

The module (1001) has disposed within it an inlet conduit (1011) which accepts newly chilled coolant from, for example, an inlet tube (1003). Coolant is guided into a first, coolant-distributing chamber (1022) that is bounded on one side by a first surface (1023). A second chamber (1002), in fluid communication with the first chamber (1022), bounded on one side by the cooling surface (1009) and on a second side by a second surface (1024) spaced from the first surface (1023), contains nozzles (1025) spanning the first and second surfaces. Fluid from the first chamber (1022) is passed through nozzles (1025) and enters the second chamber (1002), thereby interacting with the cooling surface (1009) and removing heat through fluid impingement jets characterized by high velocity flow. After removing heat from the cooling surface (1009), the coolant exits the second chamber (1002) and flows through outlet passageways (1004) to enter immediately into the dielectric fluid bath (1005) and cool peripheral heat-generating components (1010). The module (1001) is disposed on the circuit board (1006) with a fastener (1007), which may comprise, for example, bolts. Note that there could be multiple dies of varying power density underneath the cooling surface (1009), as will be seen in certain embodiments described in more detail below. There may be other components (1010) also disposed on the circuit board (1006).

The jet impingement nozzles (1025) may take on a variety of forms. They may be organized in one or multiple arrays, uniformly distributed or distributed in nonuniform configurations. The nozzles may be of circular, square, diamond, or any other shape. They may be of uniform diameter or may be of varying diameter. They may have a uniform cross section through the thickness of the surfaces they span, or may have varying cross sections such as chamfers, fillets, or tapers on either side. Jet nozzles may be concentrated over areas of higher heat generation, or hot spots, to allow for more uniform temperatures on the cooling surface and thus extend device lifetimes due to the more balanced temperatures of the semiconductors. Many other configurations are possible.

Figure 11A:
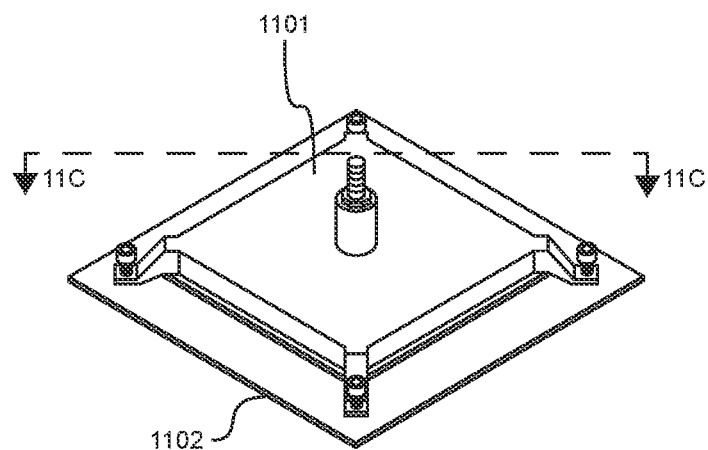
FIGS. 11A, 11B and 11C show, respectively, isometric, isometric exploded, and isometric cross section views of a flow-through, hot-spot-targeting cooling assembly containing a flow-through cooling module with jet impingement nozzles attached to a printed circuit board with fasteners.
Figure 11B:
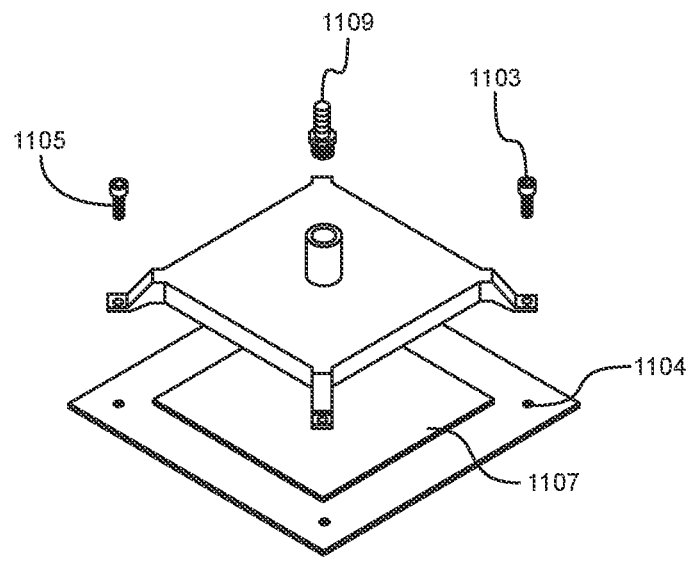
Figure 11C:
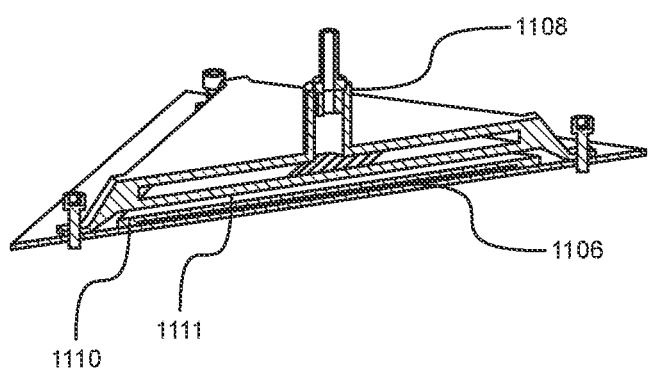

FIGS. 11A, 11B and 11C show three-dimensional views of a flow-through immersion cooling module with jet impingement. FIG. 11A shows an isometric view. FIG. 11B shows an isometric exploded view, and FIG. 11C shows an isometric cross sectional view. The module (1101) is disposed on a circuit board (1102) with mechanical fasteners (1103), threaded fastener holes (1104) in the circuit board (1102). Compression springs (1105) may be included to prevent overtightening of the fasteners, as is standard with many heat sink circuit board mounts. The module (1101) may have more or fewer mount connections than the four shown, if found to be structurally appropriate. Also disposed on the circuit board (1102) is a heat-generating component (1106), such as a semiconductor die, and a corresponding cooling surface (1107), such as that of the integrated heat spreader. Note that, in some cases, a thermal interface material may be used between components to ensure continuous thermal contact between the die and integrated heat spreader, though it is not shown in FIG. 11A, 11B or 11C. Importantly, however, there is no thermal interface material disposed between the cooling surface (1107) and the cooling module (1101). The inlet conduit (1108), in one embodiment, is in fluid communication with a barbed fitting (1109) to interface with the fluid supply (not shown). The connection to the fluid supply need not be via a barbed fitting. A variety of different types of alternative fittings may be used, including without limitation push-to-connect fittings, compression fittings, crimp fittings, weld, or other types of fittings. The outlet (1110) is open to the surrounding fluid, such that coolant fluid will disperse into the bath to continue cooling peripheral heat-generating components (not shown).

In this embodiment, the jet plate (1111) is integral with module (1101). There may be other embodiments where the jet plate (1111) is a standalone modular component. In this embodiment, the jet plate (1111) is located in the center of the cooling surface (1107). There may be other embodiments where the jet plate (1111) is spread over the whole flow-through cooling module (1101), separated into multiple areas, or separated into multiple components.

Figure 12:
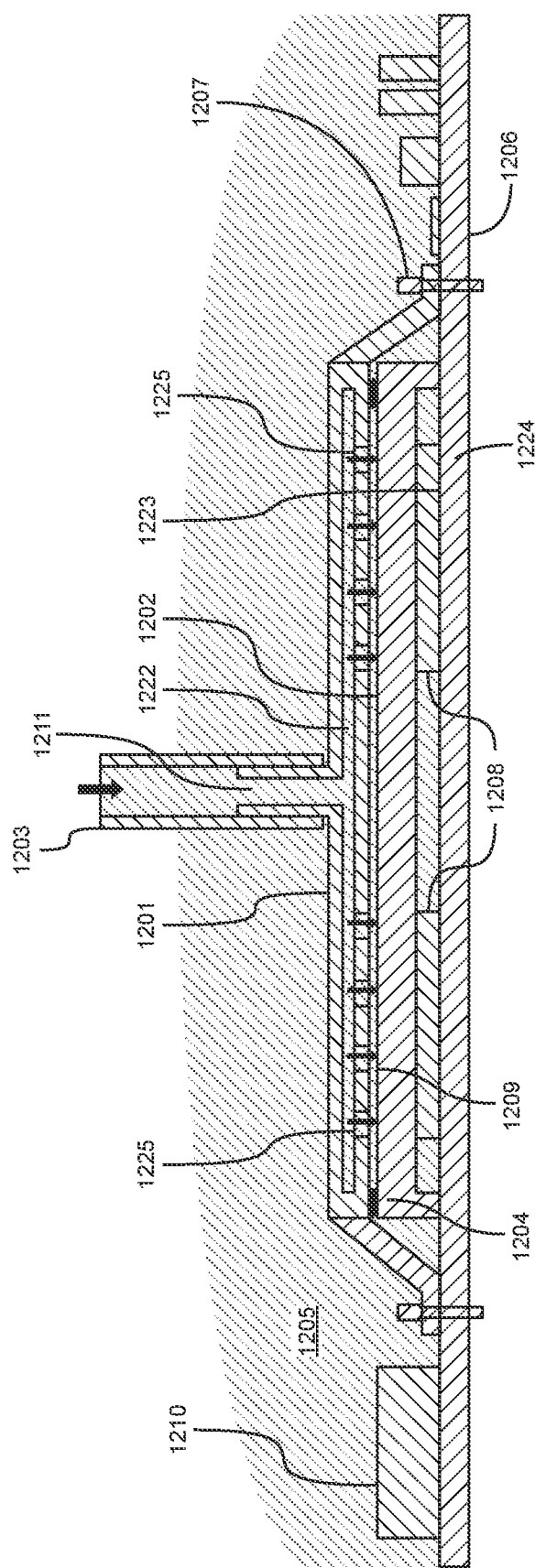
FIG. 12 shows an embodiment of a flow-through, hot-spot-targeting dielectric cooling assembly with two arrays of jet impingement nozzles targeting hot spots of a cooling surface in thermal communication with two primary heat-generating components.

In another embodiment, as shown in FIG. 12, there is provided a jet impingement immersion cooling module for hot-spot-targeting on an assembly with multiple primary heat-generating components. Two heat-generating components (1208), such as a silicon dies, are disposed on a circuit board (1206) within a dielectric bath (1205) and in thermal communication with a single cooling surface (1209), such as that of an integrated heat spreader. The flow-through cooling module (1201) has disposed within it an inlet conduit (1211) that accepts coolant from, for example, an inlet tube (1203). Coolant is guided into a first fluid chamber (1222) bound on one side by a first surface (1223). A second chamber (1202), in fluid communication with the first chamber (1222), bounded on one side by the cooling surface (1209) and on a second side by a second surface (1224) spaced from the first surface (1223), contains nozzles (1225) spanning the first and second surfaces. Fluid from the first chamber (1222) is passed through nozzles (1225) and enters the second chamber (1202), thereby interacting with the cooling surface (1209) and removing heat through fluid impingement jets characterized by high velocity flow. Note that in this embodiment, the nozzles (1225) are non-uniformly distributed across the flow-through cooling module, thereby concentrating cooling on hot spots. Hot spots may comprise the entire area of the heat-generating component(s) coupled to a larger cooling surface, or may be a subset of area within a given heat-generating component. After removing heat from the cooling surface (1209), the coolant exits the second chamber (1202) and flows through outlet passageways (1204) to enter immediately into the dielectric fluid bath (1205) and cool peripheral heat-generating components (1210). The module (1201) is disposed on the circuit board (1206) with a fastener (1207), which may comprise, for example, bolts). There may be other components (1210) also disposed on the circuit board (1206). There may be other embodiments where the dielectric fluid is routed through several fluid features to better manage fluid flow before the fluid reaches the jet impingement nozzles (1225), after impinging on the cooling surface (1209), or upon leaving the outlet passageways (1204). Such enhanced fluid flow features may include manifolding features to promote equally distributed flow to multiple impingement nozzles, turbulator features to enhance heat transfer to the primary or periphery heat-generating components, exhaust conduits for directing turbulent exhaust fluid at periphery components, radially oriented exit flow passages, and others.

Figure 13:
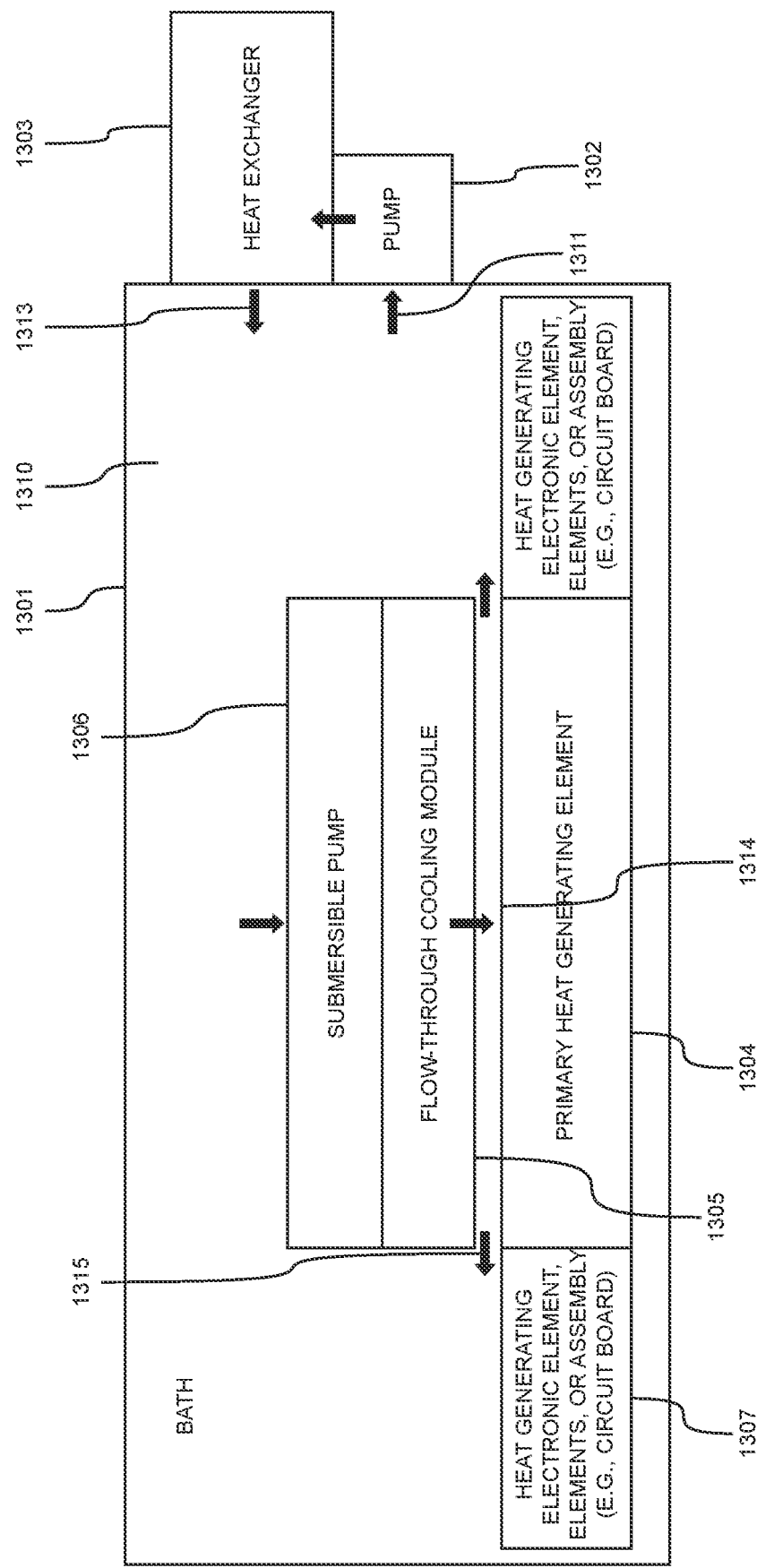
FIG. 13 shows an embodiment of a flow-through, hot-spot-targeting dielectric cooling assembly containing a submersible pump in a block diagram.
Figure 14:
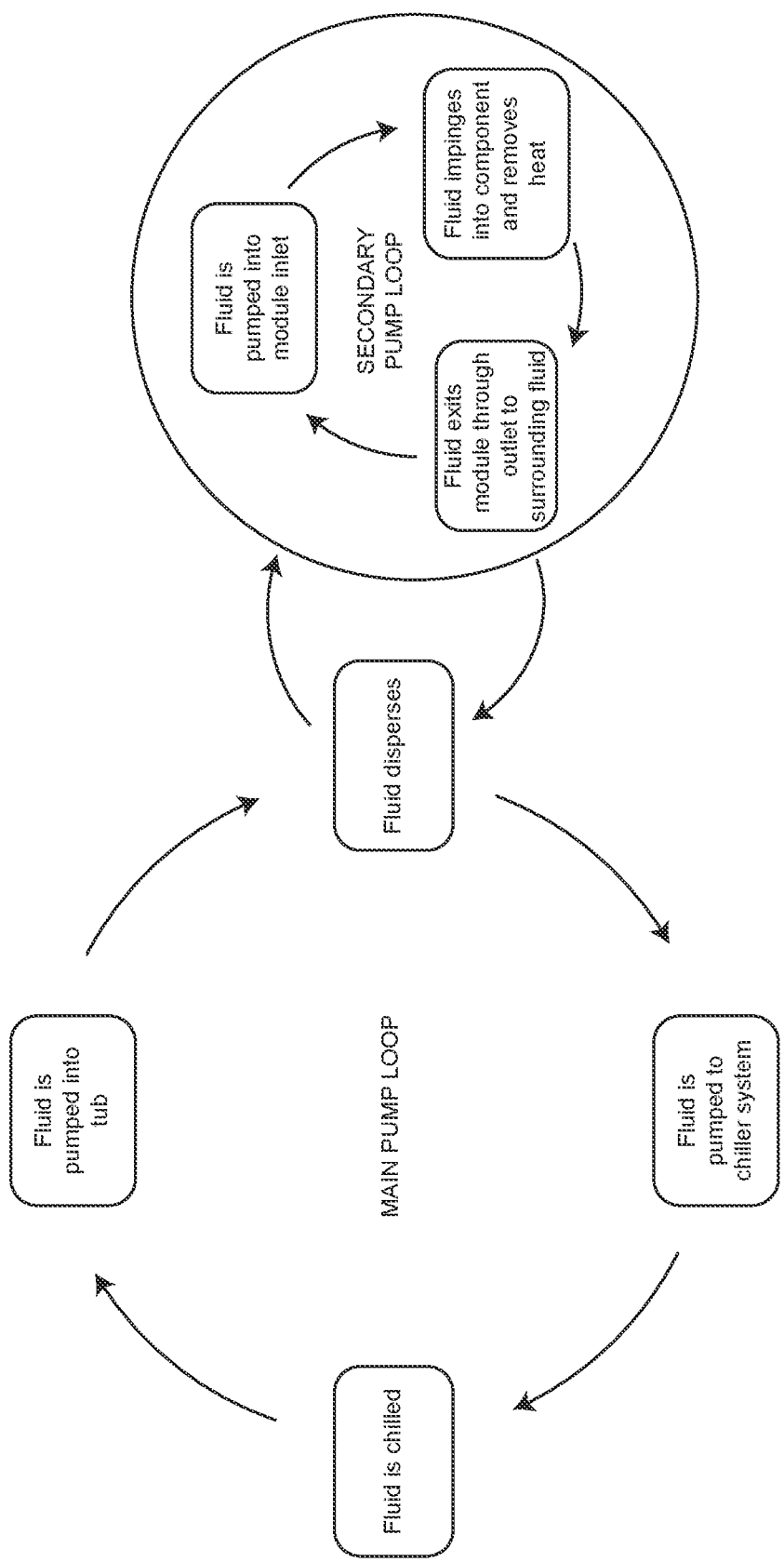
FIG. 14 shows a high-level flow chart illustrating the operational steps performed by a flow-through, hot-spot-targeting dielectric cooling assembly containing a submersible pump according to an embodiment of the present invention.

FIG. 13 shows another embodiment in which the fluid delivery to the flow-through cooling module is provided by a submersible pump, which conveys fluid directly from the surrounding bath instead of through a tube from an external pump. The dielectric fluid (1310) is cycled through the bath (1301) by an external pump (1302) and is cooled by an external heat exchanger (1303). A primary heat-generating component (1304) is mounted on a server within the bath (1301). The primary heat-generating component (1304) may be, for example, a semiconductor die forming part of a processor assembly. A flow-through cooling module (1305) is mounted at or near the primary heat-generating component (1304) and does not require a thermal interface material. Unlike current state of the art immersion baths, dielectric fluid (1310) is delivered to the flow-through cooling module (1305) through a submersible pump (1306), forming a second flow loop within the global dielectric bath flow loop. The flow-through cooling module (1305) facilitates intimate fluid contact with the primary heat-generating component (1304), carrying heat away into the surrounding bath (1301). The heated dielectric fluid (1310) then exits the vicinity of the flow-through cooling module (1305) and primary heat-generating component (1304) to interact with and cool other heat-generating electronic components (1307). The other heat-generating electronic components (207) may comprise, for example, memory chips, DIMMs, voltage regulator modules, power conversion electronics, power supplies, capacitors, processors, or other such heat-generating components common to server boards.

As these heat-generating electronic components may have less power, or less power density, compared to the primary heat-generating component such that they generate less heat, utilizing the heated dielectric coolant (1310) emerging from the vicinity of the flow-through cooling module can provide adequate cooling for the other heat-generating electronic components (1307). Flow enhancement features may be added to avoid heated flow being immediately recirculated into the submersible pump or to provide improved fluid flow contact to the heat-generating electronic component or components.

Operationally, the chilled dielectric fluid (1310) first enters the bath (1301) as indicated by arrow (1313). This flow is then pumped with the submersible pump (1306) to enter the flow-through cooling module (1305) and flows (as indicated by arrow 1314) to cool the primary heat-generating component (1304). The flow then exits (as indicated by arrow 1315) the vicinity of the flow-through cooling module (1305) and flows to cool other heat-generating electronic components (1307). The heated flow (1311) then enters the pump (1302), where it is then routed (1312) into the heat exchanger (1303). The warm dielectric coolant is chilled back down for re-entry into the bath (1301) by the heat exchanger (1312) via a facility chilled water supply or liquid-air heat exchanger, for example. Note that although it is described linearly, in reality the fluid flow between the two pumped loops is complex and may intermix in turbulent flow paths between the two pumps. This process is illustrated in the high-level flow chart shown in FIG. 14.

Other configurations are possible. For example, in certain embodiments, the assembly may comprise multiple non-submersed pumps. One pump may provide a global gentle fluid circulation, such is the case in traditional immersion assemblies. There may then be a second pump that introduces coolant to a flow-through immersion cooling module to facilitate high heat removal. The two fluid streams may then mix and be delivered back to the multiple pumps, whether directly pulling from the tank or via an intermediate fluid line.

Figure 15A:
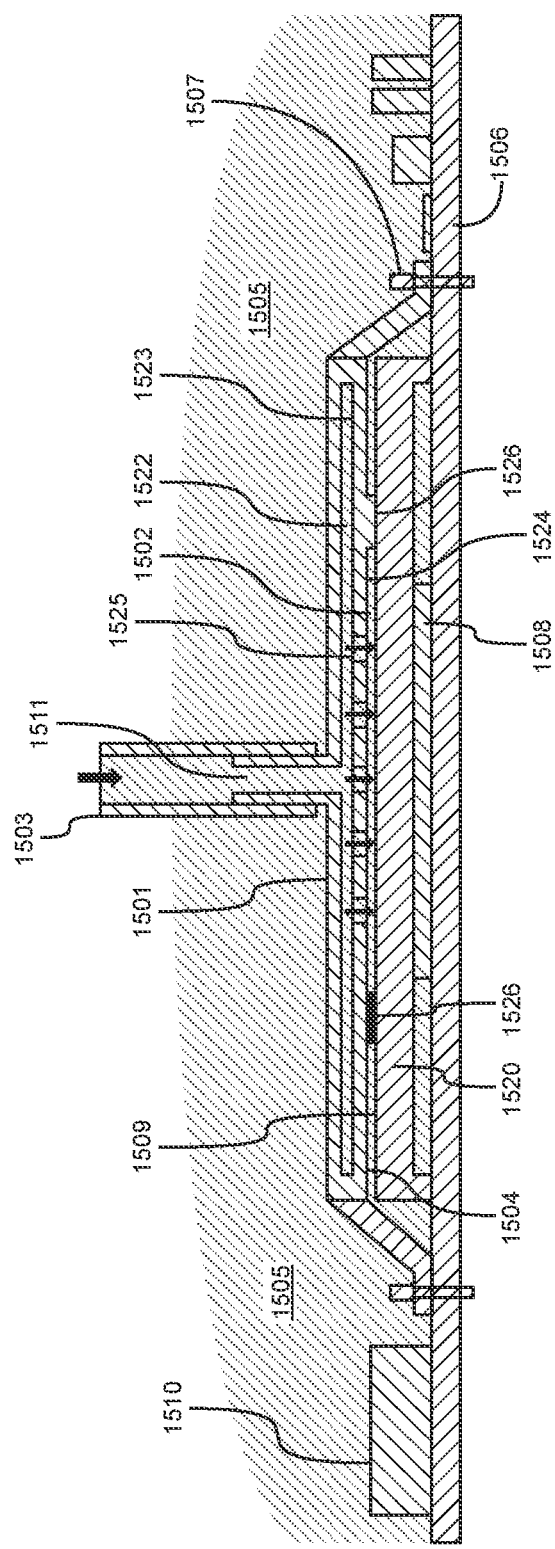
FIGS. 15A and 15B show another embodiment of a flow-through, hot-spot-targeting dielectric cooling assembly, in which the flow-through cooling module comprises contact pads that contact the cooling surface.
Figure 15B:
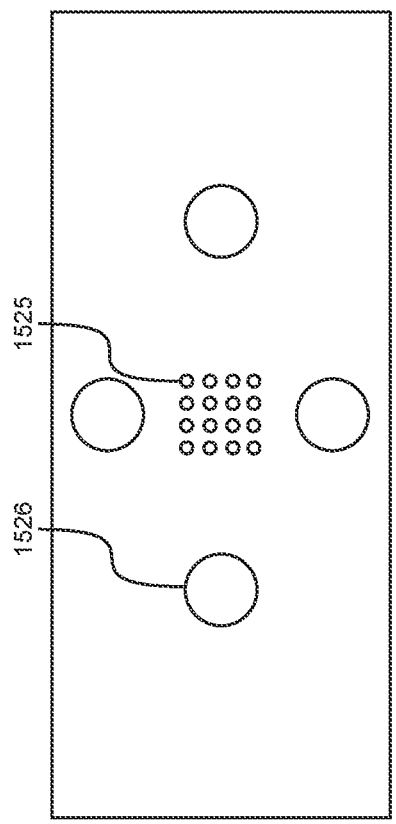

Another embodiment of a flow-through immersion cooling module, which utilizes a different arrangement of features for facilitating flow out of the flow-through module, is illustrated in FIGS. 15A and 15B. In this embodiment, the fluid-delivery arrangement includes a jet-impingement immersion cooling module (1501). In FIG. 15A, a primary heat-generating electronic component (1508), such as a silicon die, is disposed on a circuit board (1506) within a dielectric bath (1505) and in thermal communication with a cooling surface (1509), such as that of an integrated heat spreader (1520).

The module (1501) has disposed within it an inlet conduit (1511) which accepts newly chilled coolant from, for example, an inlet tube (1503). The coolant is guided by the inlet conduit (1511) into a first, coolant-distributing chamber (1522) that is bounded on one side by a first surface (1523). A second chamber (1502), in fluid communication with the first chamber (1522), bounded on one side by the cooling surface (1509) and on a second side by a second surface (1524) spaced from the first surface (1523), contains nozzles (1525) spanning the first and second surfaces. Fluid from the first chamber (1522) is passed through nozzles (1525) and enters the second chamber (1502), thereby interacting with the cooling surface (1509) and removing heat through fluid impingement jets characterized by high velocity flow. The module (1501) is disposed on the circuit board (1506) with a fastener (1507), which may comprise, for example, bolts. After removing heat from the cooling surface (1509), the coolant exits the second chamber (1502) and flows through outlet passageways (1504) to enter immediately into the dielectric fluid bath (1505) and cool peripheral heat-generating components (1510).

Contact pads (1526), extending from the second surface (1524) of cooling module (1501), contact the cooling surface (1509). These contact pads (1526) may serve multiple purposes. First, in the case of, for example, a land grid array type processor assembly, the contact pads (1526) may serve as contact points to transmit force into the processor package and down towards the circuit board (1506), to create electrical continuity between the contacts on the processor assembly and contacts on the socket. For example, the fasteners (1507) may screw into the circuit board (1506), which beneficially cause the contact pads (1526) to push down onto the cooling surface (1509). Second, they may serve as flow control features. The height of the contact pads (1526) may set a height of the outlet passageways (1504), to provide adequate space for fluid egress while maintaining a close enough distance for fluid emerging from the nozzles (1525). This may be advantageous to optimize the pressure and flow characteristics of the flow-through module.

Similarly, the contact pads (1526) may serve to set up arrangements of outlet passageways (1504) through which the coolant emerges into the dielectric bath (1505). In certain cases, if preferential flow is to be delivered to one side or the other to target particular peripheral heat-generating components (1510), the arrangement of contact pads (1526) may be chosen such that the outlet passageways (1504) toward the peripheral heat-generating components (1510) are larger or less obstructed than other sides of the cooling module. That is, flow may be preferentially delivered towards certain heat-generating components (1510) via the positioning or arrangement of contact pads (1526).

The contact pads can be seen in a different view in FIG. 15B, which shows a bottom up view of the lower side of the cooling module (1501). Nozzles (1525) may be surrounded by contact pads (1526). Although four contact pads are shown, there may be more or fewer depending on the desired outlet fluid flow and/or force requirements of the processor and socket assembly. They are also shown uniformly distributed around the nozzles in FIG. 15B; they may be non-uniformly distributed as discussed.

In embodiments comprising jet impingement and contact pads, the coolant flow accelerated through the nozzles may be configured to impinge on the cooling surface in a substantially perpendicular direction. After impingement, however, the flow may turn to travel in the outlet passageways in a substantially parallel direction to the cooling surface. The contact pads may then potentially serve as secondary heat transfer members. For example, heat from the cooling surface may conduct into the contact pads, at which point the parallel flow of the jet impingement exhaust may create a secondary impingement event onto the contact pads and continue removing heat. Although the flow profile of the exhaust parallel flow is lower than that of the primary impingement of the accelerated flow through the nozzles and onto the cooling surface, there may still be benefits from the secondary impingement to facilitate higher power processors, lower device temperatures, or higher coolant temperatures.

In sum, the present disclosure describes a variety of different embodiments of a flow-through, hot-spot-targeting immersion cooling assembly. Generally, these embodiments comprise a bath of dielectric coolant (comprising both the containment structure and the coolant, single phase or phase changing), at least one primary heat-generating component (e.g. CPU, GPU, FPGA, ASIC, etc. or sub-assemblies thereof), at least one cooling surface, in thermal communication with the at least one primary heat-generating component (e.g. semiconductor die surface, integrated heat spreader surface, ASIC package surface, etc.), at least one periphery heat-generating component (e.g. DIMM cards, power supply units, voltage regulators, disk drives, etc.), and a flow-through cooling module to provide or facilitate cooling to the at least one primary heat-generating component and the periphery heat-generating components. The flow-through cooling module can take on a variety of forms, containing features such as inlet conduits, fluid chamber for heat transfer with the cooling surface, outlet passageways to facilitate flow out of the module and towards other periphery components, arrays of impingement nozzles for enhanced heat transfer, fluid flow enhancement features to promote turbulence, promote even flow distribution, promote chilled coolant delivery to single or arrays of primary heat-generating components, facilitate intelligent flow management of heated exhaust coolants, and other such features. The flow-through cooling module may be affixed to a printed circuit board or other surface using any one of a variety of different types of fasteners, including without limitation, screws, bolts, clamps, interference fits, adhesive surfaces, solder surfaces, mechanical mating surfaces, etc. The flow-through cooling module may be connected to an external pump to circulate the fluid and facility heat exchanger to provide coolant chilling for steady state operation via a tube in fluid communication with at least one inlet conduit, or may be in fluid communication with a submersible pump within the dielectric bath.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A fluid-cooled electronic-component assembly, comprising:
    a circuit board;
    a primary heat-generating electronic component disposed on the circuit board;
    a cooling surface in thermal communication with the primary heat-generating component;
    a cooling module comprising a lower surface, a plate, a fluid distribution reservoir disposed between the lower surface and the plate, and an inlet conduit, the inlet conduit being configured to accept an inflow of coolant liquid and guide the inflow of coolant liquid to pass into the fluid reservoir through an opening in the lower surface of the cooling module;
    wherein the coolant liquid is single-phase in the fluid-cooled electronic-component assembly;
    wherein the cooling module is mounted to the circuit board in a spaced relation thereto so that (a) the plate of the cooling module will be in close proximity to the cooling surface, (b) one or more exit apertures are formed between the cooling module and the circuit board, and (c) a fluid chamber is formed, the fluid chamber being bounded on one side by the plate of the cooling module and bounded on another side by the cooling surface in thermal communication with the primary heat-generating electronic component; and
    wherein the plate comprises a plurality of apertures extending therethrough to permit the coolant liquid to pass from the fluid distribution reservoir into the fluid chamber, the plurality of apertures comprising a plurality of nozzles, respectively, configured to accelerate the flow of coolant liquid;
    whereby the coolant liquid passing through the nozzles and into the fluid chamber will come into direct contact with the cooling surface in thermal communication with the primary heat-generating component, thereby permitting the coolant liquid to absorb heat from the cooling surface before exiting the fluid chamber through the one or more exit apertures, and a secondary heat-generating electronic component disposed on the circuit board in proximity to said cooling module such that the cooling liquid will cool the secondary heat-generating electronic component after the coolant liquid exits the cooling module through the one or more exit apertures.

2. The fluid-cooled electronic-component assembly of claim 1, further comprising:
    a container to hold a dielectric bath of coolant liquid, the dielectric bath of coolant liquid including the coolant liquid that has exited the fluid chamber through the one or more exit apertures between the circuit board and the cooling module;
    a pump in fluid communication with the dielectric bath of the container; and
    a heat exchanger in fluid communication with the pump and the dielectric bath of the container;
    wherein the pump is configured and arranged to draw coolant liquid from the dielectric bath of the container, and the heat exchanger is configured and arranged to cool the coolant liquid before transferring cooled coolant liquid to the inlet conduit of the cooling module.

3. The fluid-cooled electronic-component assembly of claim 2, wherein the circuit board, the cooling surface, the primary heat-generating electronic component and the cooling module are fully, partially or intermittently immersed in the dielectric bath of coolant liquid.

4. The fluid-cooled electronic-component assembly of claim 2, wherein the pump is fully, partially or intermittently submerged in the bath.

5. The fluid-cooled electronic-component assembly of claim 1, wherein the cooling surface comprises a heat spreader.

6. The fluid-cooled electronic-component assembly of claim 5, wherein the cooling module is mounted to the circuit board via a plurality of intermittently-spaced mounts, thereby leaving gaps between the cooling module and the heat spreader, wherein the gaps form the one or more exit apertures.

7. The fluid-cooled electronic-component assembly of claim 1, further comprising a plurality of primary heat-generating electronic components, wherein each primary heat-generating electronic component in the plurality of primary heat-generating electronic components is in thermal communication with the cooling surface.

8. The fluid-cooled electronic-component assembly of claim 7, wherein said plurality of nozzles are clustered in groups at locations corresponding to the locations of said plurality of primary heat-generating electronic components.

9. The fluid-cooled electronic-component assembly of claim 7, wherein the cooling surface comprises a heat spreader.

10. The fluid-cooled electronic-component assembly of claim 1, wherein the primary heat-generating electronic component is higher in power or higher in power density than the secondary heat-generating electronic component.

11. The fluid-cooled electronic-component assembly of claim 1, wherein the primary heat-generating electronic component comprises a semiconductor die forming part of a central processing unit (CPU), or a graphics processing unit (GPU), or an application-specific integrated circuit (ASIC), or a field-programmable gate array (FPGA).

12. The fluid-cooled electronic-component assembly of claim 1, wherein the secondary heat-generating electronic component comprises a memory card, or a voltage regulator, or a power supply, or a disk drive.

13. The fluid-cooled electronic-component assembly of claim 1, further comprising one or more contact pads sandwiched between the lower surface of the cooling module and the cooling surface, wherein a height dimension of the one or more exit apertures located between the cooling module and the circuit board is defined based on a height dimension associated with the contact pads.

14. A fluid-cooled electronic-component assembly, comprising:
a circuit board;
a primary heat-generating electronic component disposed on the circuit board;
a cooling surface in thermal communication with the primary heat-generating component;
a cooling module comprising a lower surface, a plate, a fluid distribution reservoir disposed between the lower surface and the plate, and an inlet conduit, the inlet conduit being configured to accept an inflow of coolant liquid and guide the inflow of coolant liquid to pass into the fluid reservoir through an opening in the lower surface of the cooling module;
wherein the coolant liquid is single-phase in the fluid-cooled electronic-component assembly;
wherein the cooling module is mounted to the circuit board in a spaced relation thereto so that (a) the plate of the cooling module will be in close proximity to the cooling surface, (b) one or more exit apertures are formed between a bottom of the cooling module and the circuit board, and (c) a fluid chamber is formed, the fluid chamber being bounded on one side by the plate of the cooling module and bounded on another side by the cooling surface in thermal communication with the primary heat-generating electronic component;
the plate having a plurality of apertures extending therethrough to permit the coolant liquid to pass from the fluid distribution reservoir into the fluid chamber, wherein said plurality of apertures comprises a plurality of nozzles, respectively, configured to accelerate the flow of coolant liquid;
a container configured to hold a dielectric bath of coolant liquid, the dielectric bath of coolant liquid including coolant liquid that has exited the fluid chamber through the one or more exit apertures between the circuit board and the cooling module;
a submersible pump submersed within the dielectric bath contained within the container, the submersible pump having an outlet that is in fluid communication with the inlet conduit of the cooling module, and configured to draw coolant liquid from the dielectric bath and deliver coolant liquid to the inlet conduit; and
wherein the circuit board, the primary heat-generating electronic component and the cooling module are fully, partially or intermittently immersed within the dielectric bath of coolant liquid contained in the container.

15. The fluid-cooled electronic-component assembly of claim 14, wherein the cooling surface comprises a heat spreader.

16. The fluid-cooled electronic-component assembly of claim 15, wherein the cooling module is mounted to the circuit board via a plurality of intermittently-spaced mounts, thereby leaving gaps between the cooling module and the heat spreader, wherein the gaps form the one or more exit apertures.

17. The fluid-cooled electronic-component assembly of claim 14, wherein the cooling module further comprises a plurality of intermittently spaced mounts, the mounts being adapted to accept fasteners to fix the cooling module to the circuit board thereof, thereby leaving gaps that form the one or more exit apertures.

18. The fluid-cooled electronic-component assembly of claim 14, further comprising a plurality of primary heat-generating electronic components, wherein each primary heat-generating electronic component in the plurality of primary heat-generating electronic components is in thermal communication with the cooling surface.

19. The fluid-cooled electronic-component assembly of claim 18, wherein said plurality of nozzles are clustered in groups at locations corresponding to the locations of said plurality of primary heat-generating electronic components.

20. The fluid-cooled electronic-component assembly of claim 18, wherein the cooling surface comprises a heat spreader.

* * * * *